United States Patent
Kim et al.

(10) Patent No.: US 9,847,105 B2
(45) Date of Patent: Dec. 19, 2017

(54) MEMORY PACKAGE, MEMORY MODULE INCLUDING THE SAME, AND OPERATION METHOD OF MEMORY PACKAGE

(71) Applicant: Samsung Electronics Co., Ltd., Gyeonggi-do (KR)

(72) Inventors: Chankyung Kim, Hwaseong-si (KR); Uksong Kang, Seongnam-si (KR); Nam Sung Kim, Champaign, IL (US)

(73) Assignee: SAMSUNG ELECTRIC CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 16 days.

(21) Appl. No.: 15/012,845

(22) Filed: Feb. 1, 2016

(65) Prior Publication Data
US 2017/0220293 A1    Aug. 3, 2017

(51) Int. Cl.
G06F 12/06 (2006.01)
G11C 5/02 (2006.01)
G11C 5/06 (2006.01)
G11C 11/406 (2006.01)

(52) U.S. Cl.
CPC ............ *G11C 5/02* (2013.01); *G06F 12/0638* (2013.01); *G11C 5/06* (2013.01); *G11C 11/40611* (2013.01); *G06F 2212/205* (2013.01)

(58) Field of Classification Search
CPC ............ G06F 12/0638; G06F 13/1636; G06F 2212/205; G11C 11/401–11/4099
See application file for complete search history.

(56) References Cited

U.S. PATENT DOCUMENTS

| | | | |
|---|---|---|---|
| 4,860,333 A * | 8/1989 | Bitzinger | H04Q 3/5455 379/15.01 |
| 7,679,133 B2 | 3/2010 | Son et al. | |
| 8,233,303 B2 | 7/2012 | Best et al. | |
| 8,363,444 B2 | 1/2013 | Kim et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,824,221 B2 | 9/2014 | Cho et al. | |
| 8,930,647 B1 | 1/2015 | Smith | |
| 8,977,806 B1 | 3/2015 | Rosenband et al. | |
| 2008/0065845 A1 * | 3/2008 | Montero | G06F 1/3225 711/162 |

(Continued)

FOREIGN PATENT DOCUMENTS

WO    WO2014/178856 A1    11/2014

OTHER PUBLICATIONS

Jacob et al. Memory Systems: Cache, DRAM, Disk. 2007. Morgan Kaufmann. pp. 417-421.*

(Continued)

*Primary Examiner* — Nathan Sadler
(74) *Attorney, Agent, or Firm* — Muir Patent Law, PLLC

(57) ABSTRACT

Disclosed is a memory package. The memory package includes a nonvolatile memory chip, a volatile memory chip of which an access speed is faster than an access speed of the nonvolatile memory chip, and a logic chip for performing a refresh operation about the volatile memory chip in response to a refresh command from an external device, and migrating at least a portion of data stored in the nonvolatile memory chip to the volatile memory chip when the refresh operation is performed.

17 Claims, 21 Drawing Sheets

(56) References Cited

U.S. PATENT DOCUMENTS

| | | | | |
|---|---|---|---|---|
| 2009/0119444 | A1* | 5/2009 | Davis | G06F 12/0638 |
| | | | | 711/103 |
| 2009/0193186 | A1* | 7/2009 | Barth, Jr. | G06F 12/0862 |
| | | | | 711/106 |
| 2009/0268504 | A1* | 10/2009 | Kimura | G11C 11/22 |
| | | | | 365/145 |
| 2010/0110748 | A1 | 5/2010 | Best et al. | |
| 2011/0233648 | A1 | 9/2011 | Seol et al. | |
| 2013/0077382 | A1* | 3/2013 | Cho | G11C 5/04 |
| | | | | 365/148 |
| 2013/0275682 | A1 | 10/2013 | Ramanujan et al. | |
| 2014/0040550 | A1 | 2/2014 | Nale et al. | |
| 2014/0355363 | A1 | 12/2014 | Byeon | |
| 2015/0193302 | A1* | 7/2015 | Hyun | G11C 29/52 |
| | | | | 714/764 |
| 2015/0363311 | A1* | 12/2015 | Munetoh | G06F 12/0638 |
| | | | | 711/103 |
| 2015/0378841 | A1* | 12/2015 | Jayakumar | G06F 9/4401 |
| | | | | 714/6.12 |
| 2016/0085585 | A1* | 3/2016 | Chen | G06F 12/08 |
| | | | | 711/154 |
| 2016/0320826 | A1* | 11/2016 | Taha | G06F 1/3287 |

OTHER PUBLICATIONS

Michael Feldman. "Hybrid Memory Cube Angles for Exascale." Jul. 2012. http://www.hpcwire.com/2012/07/10/hybrid_memory_cube_angles_for_exascale/.*

AgigA Tech. "NVDIMM Messaging and FAQ." Jan. 2014. https://www.snia.org/sites/default/files/NVDIMM%20Messaging%20and%20FAQ%20Jan%2020143.pdf.*

Chang et al. "Improving DRAM Performance by Parallelizing Refreshes with Accesses." Feb. 2014. IEEE. HPCA 2014.*

* cited by examiner

MEMORY PACKAGE, MEMORY MODULE INCLUDING THE SAME, AND OPERATION METHOD OF MEMORY PACKAGE

BACKGROUND

The present disclosure relates to a semiconductor memory, and more particularly, relates to a memory package, a memory module having the same, and an operating method thereof.

A semiconductor memory may be a memory device that is implemented using a semiconductor such as silicon (Si), germanium (Ge), gallium arsenide (GaAs), indium phospide (InP), or the like. Semiconductor memory devices are typically divided into a volatile memory device and a nonvolatile memory device.

A volatile memory device refers to a memory device in which stored data is lost when a power supply is shut down. On the other hand, a nonvolatile memory device refers to a memory device that retains stored data when a power supply is shut down. Because a dynamic random access memory (DRAM) that is a kind of volatile memory device has a high access speed, the DRAM is widely used as a working memory, a buffer memory, a main memory, and the like of a computing system. With the development of computing technologies, a demand on DRAM as a working memory of computing systems is increasing. Because a DRAM memory cell generally includes a capacitor and a transistor, it is difficult to reduce a cell size smaller than a constant level. Thus, it is difficult to implement a high-capacity DRAM within a limited area.

To address this issue, a nonvolatile dual in-line memory module (NVDIMM) that operates based on a nonvolatile memory and a DRAM has been developed. The NVDIMM may provide a high-capacity working memory by combining a high-capacity nonvolatile memory and a DRAM. However, because an operating characteristic, an operating method, and the like of the nonvolatile memory are different from those of the DRAM, various methods may need to be used for controlling and managing them.

SUMMARY

Embodiments of the inventive concepts provide a memory package, a memory module having the same, and an operating method thereof, which perform a data migration during a refresh operation and have an increased storage capacity without a performance reduction.

In accordance with one aspect of the inventive concept, a memory package may include a nonvolatile memory chip, a volatile memory chip of which an access speed is faster than an access speed of the nonvolatile memory chip, and a logic chip for performing a refresh operation about the volatile memory chip in response to a refresh command from an external device, and migrating at least a portion of data stored in the nonvolatile memory chip to the volatile memory chip when the refresh operation is performed.

The nonvolatile memory chip and the volatile memory chip may be stacked in a direction perpendicular to the logic chip, and the nonvolatile memory chip, the volatile memory chip, and the logic chip may be connected to each other through a through silicon via.

In accordance with another aspect of the inventive concept, a memory module may include a memory package including a volatile memory chip and a nonvolatile memory chip, and a random access memory (RAM) control device for controlling the memory package under control of an external device, and to periodically transmit a refresh command to the memory package. The memory package may perform a refresh operation about the volatile memory chip in response to the refresh command, and may migrate at least a portion of data stored in the nonvolatile memory chip to the volatile memory chip during the refresh operation.

The memory package may include a plurality of data signal lines. The memory package may exchange data with the external device through a portion of the data signal lines, and may migrate at least a portion of data stored in the nonvolatile memory chip to the volatile memory chip through remaining portion of the data signal lines.

In accordance with another aspect of the inventive concept, a memory package comprises a volatile memory chip and a nonvolatile memory chip. An operation method of the memory package comprises receiving a refresh command from an external device; and migrating at least a portion of data stored in the nonvolatile memory chip to the volatile memory chip upon performing a refresh operation on the volatile memory device in response to the refresh command.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
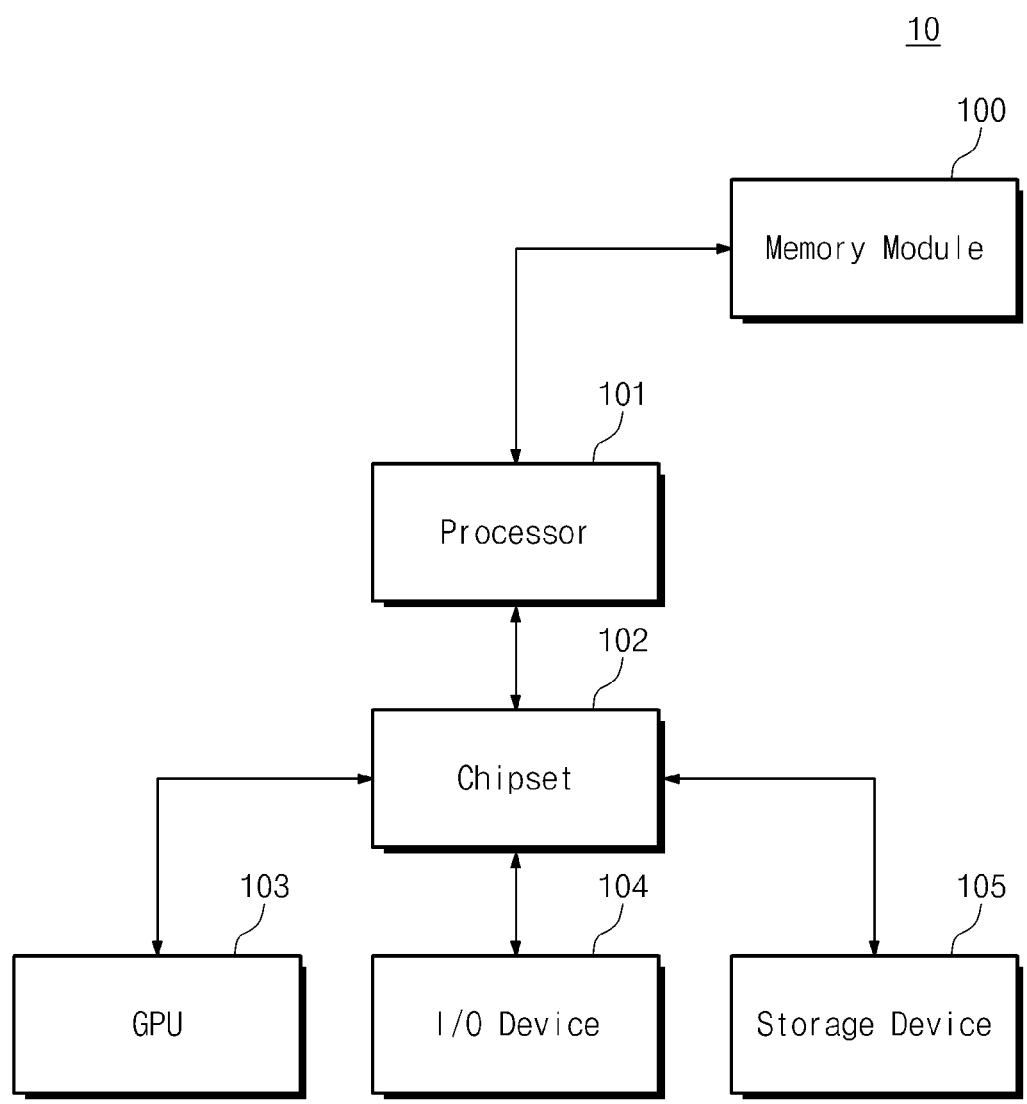
FIG. 1 is a block diagram illustrating a user system according to certain embodiments of the inventive concept.

In the following detailed description, only certain exemplary embodiments of the present invention have been shown and described, simply by way of illustration.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. A package may refer to a single package substrate with one or more chips stacked thereon, or a package-on-package device with a plurality of single packages stacked on each other. These devices may be formed using ball grid arrays, wire bonding, through substrate vias, or other electrical connection elements, and may form memory devices such as volatile or non-volatile memory devices.

Additionally, as used herein, the term "memory device" generally refers to a memory chip or stack of memory chips, and/or and a memory package. A memory package refers to a semiconductor package that includes a memory chip. For example, a memory package may include a package substrate and at least one semiconductor chip that includes a memory cell array (such a chip may also be referred to as a memory chip). A memory package may include a memory chip in addition to a logic chip such as, for example, a memory controller. A memory package will typically include an encapsulant protecting circuitry of the package substrate and one or more chips stacked thereon. In some cases, a memory package may have at least two chips horizontally separated from each other, which share the same encapsulant.

A memory module, as used herein, includes a plurality of memory packages, memory chips, or stacks of memory chips horizontally separated from each other and formed on a substrate such as a printed circuit board. Each memory package, memory chip, or stack of memory chips at a particular horizontal location of the memory module typically includes its own encapsulant.

An electronic device, as used herein, may refer generally to a semiconductor device, memory device, or memory module, and may additionally include products that include these devices, such as a memory card, hard drive including additional components, or a mobile phone, laptop, tablet, desktop, camera, or other consumer electronic device, etc.

A chip refers to a semiconductor device formed from a wafer, such as an integrated circuit formed on a die. As used herein, a chip does not include a package substrate or PCB.

A memory module according to certain embodiments of the inventive concept may include a first memory package. The first memory package may include a volatile memory chip and a nonvolatile memory chip. To maintain data of the volatile memory chip in the memory package, the memory package may periodically perform a refresh operation. Here, the memory package may perform a data migration from the nonvolatile memory chip to the volatile memory chip. Accordingly, embodiments of the inventive concept may provide a memory package and a memory module having an improved performance and an increased capacity.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views, perspective views, and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Electrically connected items may be described as directly physically connected to indicate that they are directly physically adjacent to each other.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram illustrating a user system according to an embodiment of the inventive concept. Referring to FIG. 1, a user system 10 may include a processor 101, a memory module 100, a chipset 102, a graphic processing unit (GPU) 103, an input/output device 104, and a storage device 105. In example embodiments, the user system 10 may be an electronic device and may include a computer, a portable computer, an ultra-mobile personal computer (UMPC), a workstation, a server computer, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, or one of various electronic devices which constitute a home network.

The processor 101 may control an overall operation of the user system 10. The processor 101 may perform various operations which are performed in the user system 10.

The memory module 100 may be used as a buffer memory, a main memory, a working memory, and the like of the user system 10. The memory module 100 may be directly connected to the processor 101. For example, the memory module 100 may have a form of a dual in-line memory module (DIMM), and the memory module 100 may be installed in a DIMM socket directly connected to the processor 101 so as to communicate with the processor 101. In this sense, the memory module 100 may be electrically connected to the processor 101 without any other integrated circuit devices, such as other chips, packages, or modules therebetween.

The chipset 102 may be electrically connected to the processor 101 and may control hardware of the user system 10 under control of the processor 101. For example, the chipset 102 may be connected to the GPU 103, the input/output device 104, and the storage device 105 through main buses and may perform a bridge operation about the main buses.

The GPU 103 may perform a series of arithmetic operations for outputting image data of the user system 10. In example embodiments, the GPU 103 may be installed in the processor 101 in the form of a system-on-chip (SoC).

The input/output device 104 may include various devices for inputting data or an instruction to the user system 10 or outputting data to an external device. For example, the input/output device 104 may include user input devices such as a keyboard, a keypad, a button, a touch panel, a touch screen, a touch pad, a touch ball, a camera, a microphone, a gyroscope sensor, a vibration sensor, a piezoelectric element, a temperature sensor, a biometric sensor, and the like, and user output devices such as a liquid crystal display (LCD), an organic light emitting diode (OLED) display device, an active matrix OLED (AMOLED) display device, a light emitting diode (LED), a speaker, a motor, and the like.

The storage device 105 may be used as mass storage medium of the user system 10. The storage device 105 may include mass storage media such as a hard disk drive (HDD), a solid state drive (SSD), a memory card, a memory stick, and the like.

In example embodiments, the memory module 100 may write or output data under control of the processor 101. In example embodiments, the memory module 100 may include various types of memories. For example, the memory module 100 may be a hybrid memory and may be implemented based on various memory devices: a volatile memory device such as a DRAM, a static random access memory (SRAM), a synchronous DRAM (SDRAM), or a nonvolatile memory device such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

Figure 2:
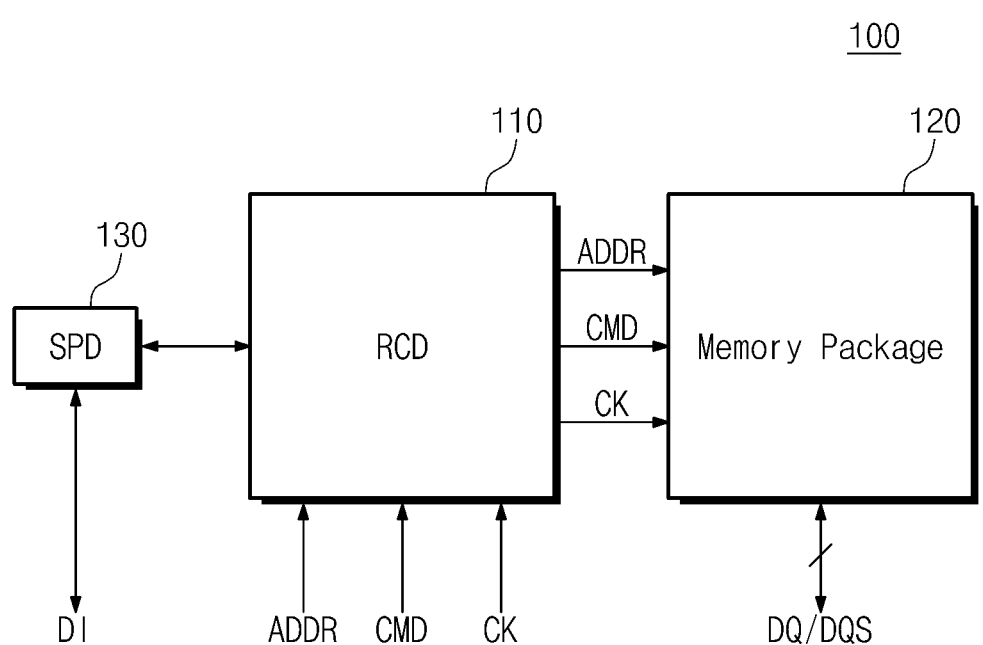
FIG. 2 is a block diagram illustrating an exemplary memory module such as illustrated in FIG. 1, according to certain embodiments.

FIG. 2 is a block diagram illustrating an exemplary memory module such as illustrated in FIG. 1. Referring to FIGS. 1 and 2, the memory module 100 may include a RAM control device (RCD) 110, a memory package 120, and a serial presence detect chip (SPD) 130.

The RCD 110 may control the memory package 120 under control of the processor 101. For example, the RCD 110 may receive an address ADDR, a command CMD, and a clock CK from the processor 101. In response to received signals, the RCD 110 may control the memory package 120 such that data received through a data signal DQ and a data strobe signal DQS is written in the memory package 120 or such that data stored in the memory package 120 is outputted through the data signal DQ and the data strobe signal DQS. In example embodiments, the RCD 110 may transmit the address ADDR, the command CMD, and the clock CK from the processor 101 to the memory package 120. The RCD 110 may be part of, for example, a chip such as a logic chip. The RCD 110 may be referred to herein as a RAM control circuit, or more generally a control circuit.

The memory package 120 may write data received through the data signal DQ and the data strobe signal DQS under control of the RCD 110. Alternatively, the memory package 120 may output the written data through the data signal DQ and the data strobe signal DQS under control of the RCD 110. In example embodiments, the memory package 120 may include various types of memory devices (e.g., memory chips). For example, the memory package 120 may include a NAND flash-based nonvolatile memory device and a DRAM-based volatile memory device. In example embodiments, the memory package 120 may include a volatile memory device such as a DRAM, an SRAM, an SDRAM, or a nonvolatile memory device such as a ROM, a PROM, an EPROM, an EEPROM, a flash memory device, a PRAM, a MRAM, a RRAM, or a FRAM.

In example embodiments, the memory module 100 may include a plurality of memory packages. Each of the memory packages may operate under control of the RCD 110. In example embodiments, each of the memory packages may communicate with the RCD 110 based on a double data rate (DDR) interface.

In certain embodiments, the SPD 130 may be a programmable read only memory (e.g., EEPROM). The SPD 130 may include initial information or device information DI of the memory module 100. In example embodiments, the SPD 130 may include the initial information or the memory system information MSI such as a module form, a module configuration, a storage capacity, a module type, an execution environment, and the like of the memory module 100. When the user system 10 including the memory module 100 is booted up, the processor 101 may read the memory system information MSI from the SPD 130 and may recognize the memory module 100 based on the memory system information MSI. The processor 101 may control the memory module 100 based on the memory system information MSI from the SPD 130. For example, the processor 101 may recognize a type of the memory package 120 included in the memory module 100 based on the memory system information MSI from the SPD. Thus, some of the memory system information MSI may be module information, or more specifically, some of the memory system information MSI may be device information.

In example embodiments, the SPD 130 may communicate with the processor 101 through a serial bus. The processor 101 may exchange a signal with the SPD 130 through a serial bus. The SPD 130 may communicate with the RCD 110 through a serial bus. The serial bus may include at least one of 2-line serial buses such as an inter-integrated circuit (I2C), a system management bus (SMBus), a power management bus (PMBus), an intelligent platform management interface (IPMI), a management component transport protocol (MCTP), and the like.

In example embodiments, the memory package 120 may be a hybrid memory package including a nonvolatile memory device and a volatile memory device (e.g., a nonvolatile memory chip and a volatile memory chip). The memory module 100 including a hybrid memory package may be a nonvolatile DIMM (NVDIMM). An operating speed of a nonvolatile memory device may be slower than that of a volatile memory device. Accordingly, the memory package 120 may migrate data stored in a nonvolatile memory device to a volatile memory device. In example embodiments, the memory package 120 may perform a refresh operation and a migration operation together in response to a refresh command.

According to certain embodiments of the inventive concept, in the memory module 100, the memory package 120 including a nonvolatile memory device and a volatile memory device may perform migration during a refresh operation, thereby increasing a memory capacity without loss of performance. As a result, a memory module having a reduced cost and an improved performance may be provided.

Figure 3:
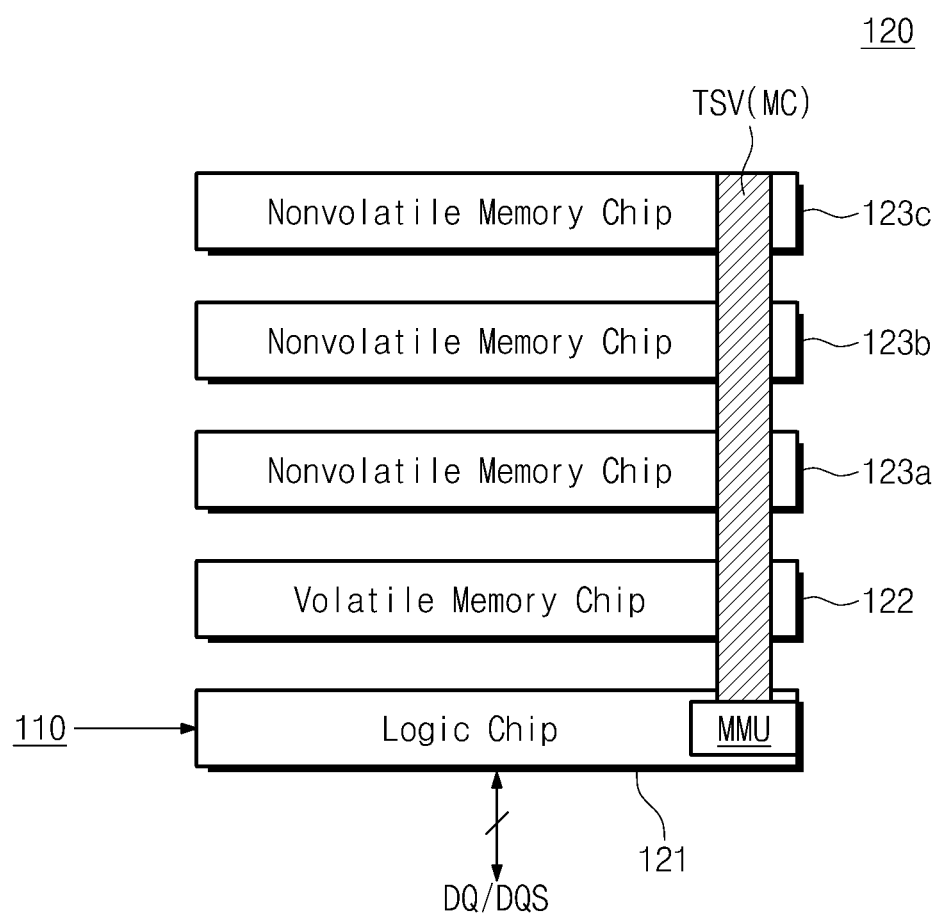
FIG. 3 is a diagram illustrating an exemplary memory package such as illustrated in FIG. 2, according to certain embodiments.
Figure 4:
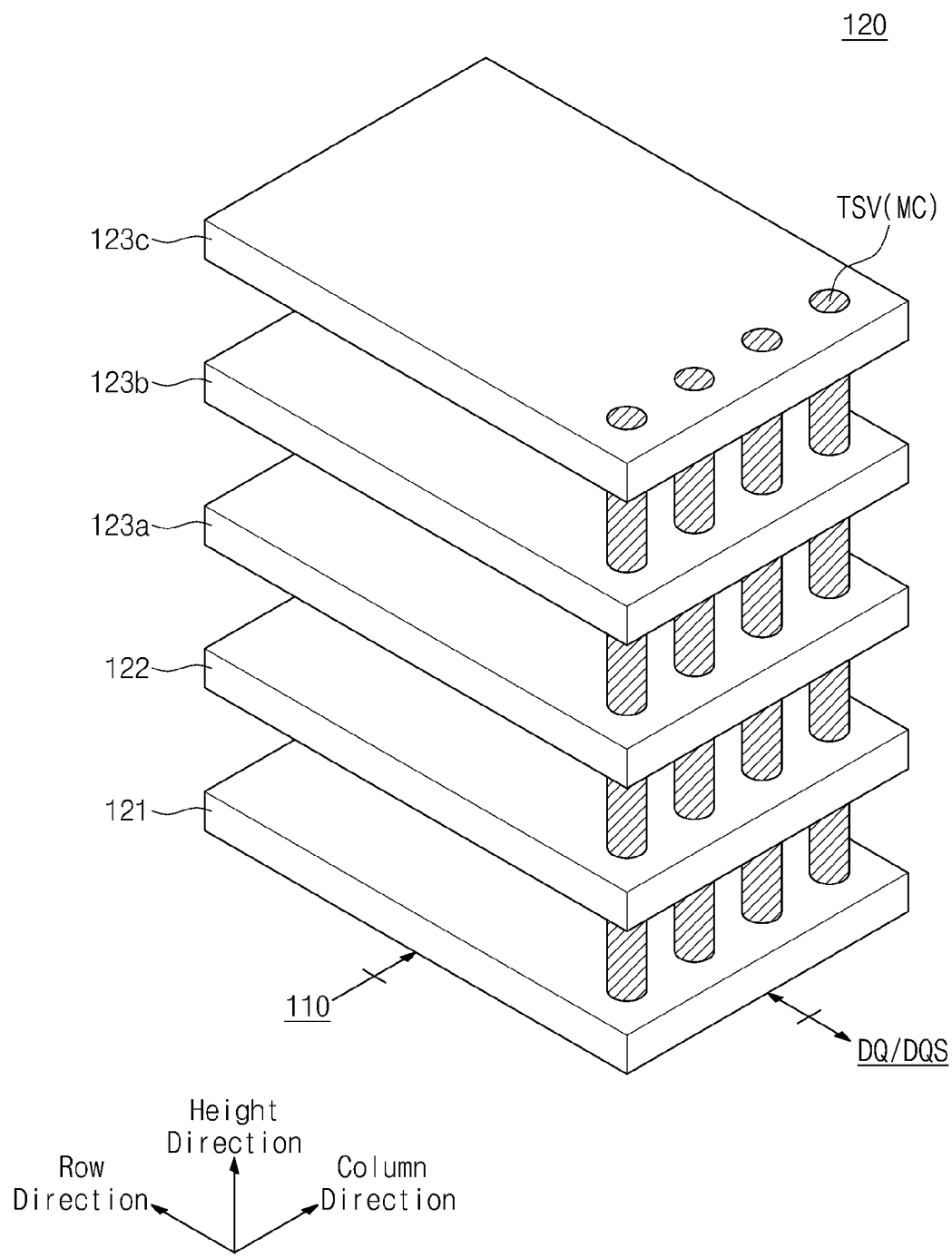
FIG. 4 is a perspective view illustrating an exemplary memory package such as illustrated in FIG. 3, according to certain embodiments.

FIG. 3 is a diagram illustrating an exemplary memory package such as illustrated in FIG. 2. FIG. 4 is a perspective view illustrating a memory package illustrated in FIG. 3. Referring to FIGS. 3 and 4, the memory package 120 may include a logic chip 121, a volatile memory chip 122, and a first to third nonvolatile memory chips 123a to 123c. In example embodiments, the memory package 120 may include additional volatile memory chips or nonvolatile memory chips. The memory package 120 may be a hybrid memory package.

Under control of the RCD 121, the logic chip 121 may write data received through a data signal DQ and a data strobe signal DQS in the volatile memory chip 122 or the first to third nonvolatile memory chips 123a to 123c. Under control of the RCD 121, the logic chip 121 may output data written in the volatile memory chip 122 or the first to third nonvolatile memory chips 123a to 123c through the data signal DQ and the data strobe signal DQS.

The logic chip 121 may include a migration managing unit MMU. The migration managing unit MMU may move, copy, or migrate data written in the first to third nonvolatile memory chips 123a to 123c to the volatile memory chip 122. The logic chip 121 may include logic circuits for performing such tasks.

In example embodiments, the logic chip 121 may further include a buffer circuit for buffering a signal (e.g., command CMD, address ADDR, data signal DQ, or data strobe signal DQS) received from an external device, a nonvolatile memory control circuit for controlling the first to third nonvolatile memory chips 123a to 123c, or an address managing circuit for managing an address of the volatile memory chip 122 and the first to third nonvolatile memory chips 123a to 123c.

Under control of the logic chip 121, the volatile memory chip 122 may write data or may output the written data. In example embodiments, the volatile memory chip 122 may be a SRAM or a DRAM. For the sake of brevity, it is assumed that the volatile memory chip 122 is a DRAM.

Under control of the logic chip 121, each of the first to third nonvolatile memory chips 123a to 123c may write data or may output the written data. In example embodiments, each of the first to third nonvolatile memory chips 123a to 123c may include at least one of a ROM, a PROM, an EPROM, an EEPROM, a flash memory device, a PRAM, an MRAM, a RRAM, or a FRAM. For the sake of brevity, it is assumed that each of the first to third nonvolatile memory chips 123a to 123c include a flash memory device.

In certain example embodiments, the storage capacity of the volatile memory chip 122 may be smaller than that of the first to third nonvolatile memory chips 123a to 123c. An access speed of the volatile memory chip 122 may be faster than those of the first to third nonvolatile memory chips 123a to 123c.

Each of the logic chip 121, the volatile memory chip 122, and the first to third nonvolatile memory chips 123a to 123c which are included in the memory package 120 may be a separate semiconductor chip or a separate die. The logic chip 121, the volatile memory chip 122, and the first to third nonvolatile memory chips 123a to 123c which are included in the memory package 120 may be stacked in a direction perpendicular to a plane defined along a row direction and a column direction. The logic chip 121, the volatile memory chip 122, and the first to third nonvolatile memory chips 123a to 123c which are stacked may be connected to each other through a plurality of through substrate vias TSVs (e.g., through silicon vias). In example embodiments, the logic chip 121 may control each of the volatile memory chip 122 and the first to third nonvolatile memory chips 123a to 123c through the through substrate vias TSV.

In example embodiments, the migration managing unit MMU may perform a migration operation through a migration channel MC. The migration channel MC may be independent of a channel of the data signal DQ and the data strobe signal DQS. For example, the migration managing unit MMU may perform a migration operation through the through substrate via TSV. That is, the through substrate via TSV may be used as the migration channel MC. The migration managing unit MMU may perform transmission and reception about data to be migrated through the through substrate via TSV. In example embodiments, the migration channel MC may be implemented with a serial link.

As described above, because the storage capacity of the first to third nonvolatile memory chips 123a to 123c is greater than that of the volatile memory chip 122, a total of memory capacity of the memory package 120 may increase by storing data in the first to third nonvolatile memory chips 123a to 123c. However, because the access speed of each of the first to third nonvolatile memory chips 123a to 123c is slower than that of the volatile memory chip 122, a total of performance may decrease. Accordingly, the memory package 120 according to example embodiments may migrate a portion of data stored in the first to third nonvolatile memory chips 123a to 123c to the volatile memory chip 122 under a specific condition. In example embodiments, the specific condition may include the following: the case where there is data to be migrated, the case where a refresh operation is performed, and the like. Data to be accessed by the RCD 110 or the processor 101 may be stored in the volatile memory chip 122 through a migration operation. Accordingly, the RCD 110 or the processor 101 may access the volatile memory chip 122, thereby making it possible to improve performance and to increase memory capacity.

Figure 5:
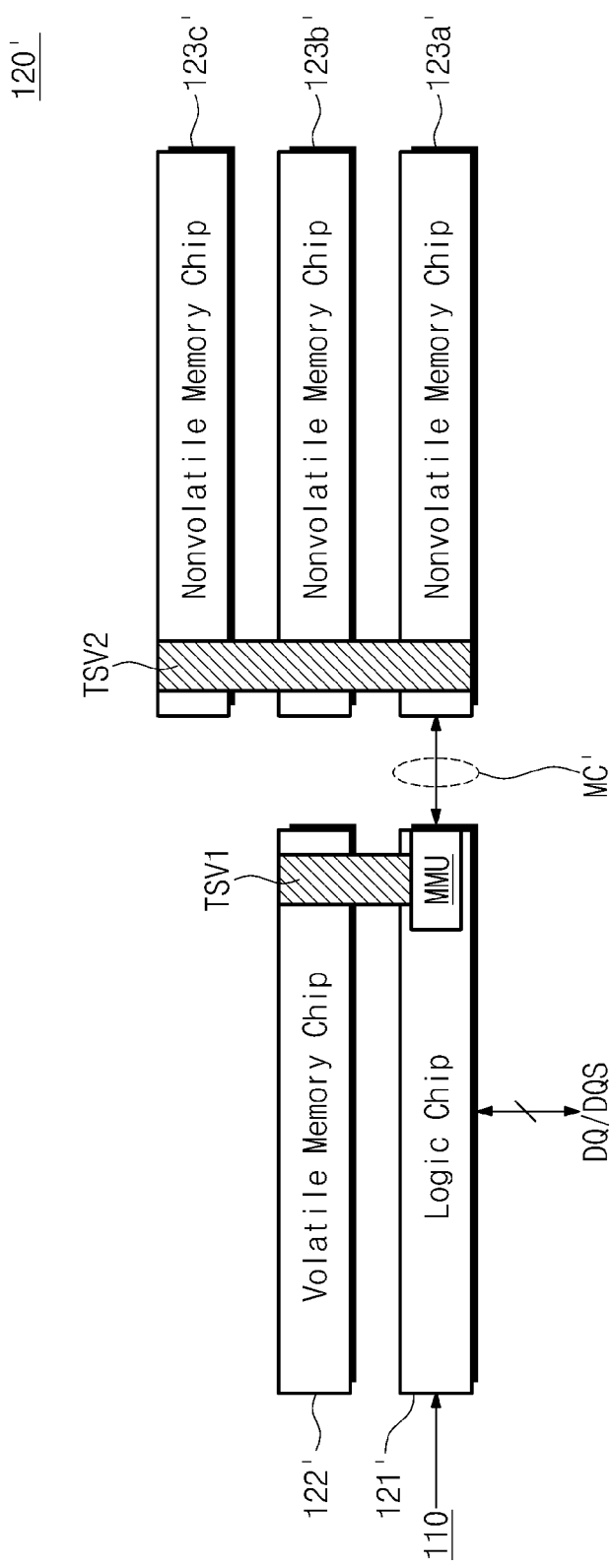
FIG. 5 is a block diagram illustrating an exemplary memory package such as illustrated in FIG. 2, according to certain embodiments of the inventive concept.
Figure 6:
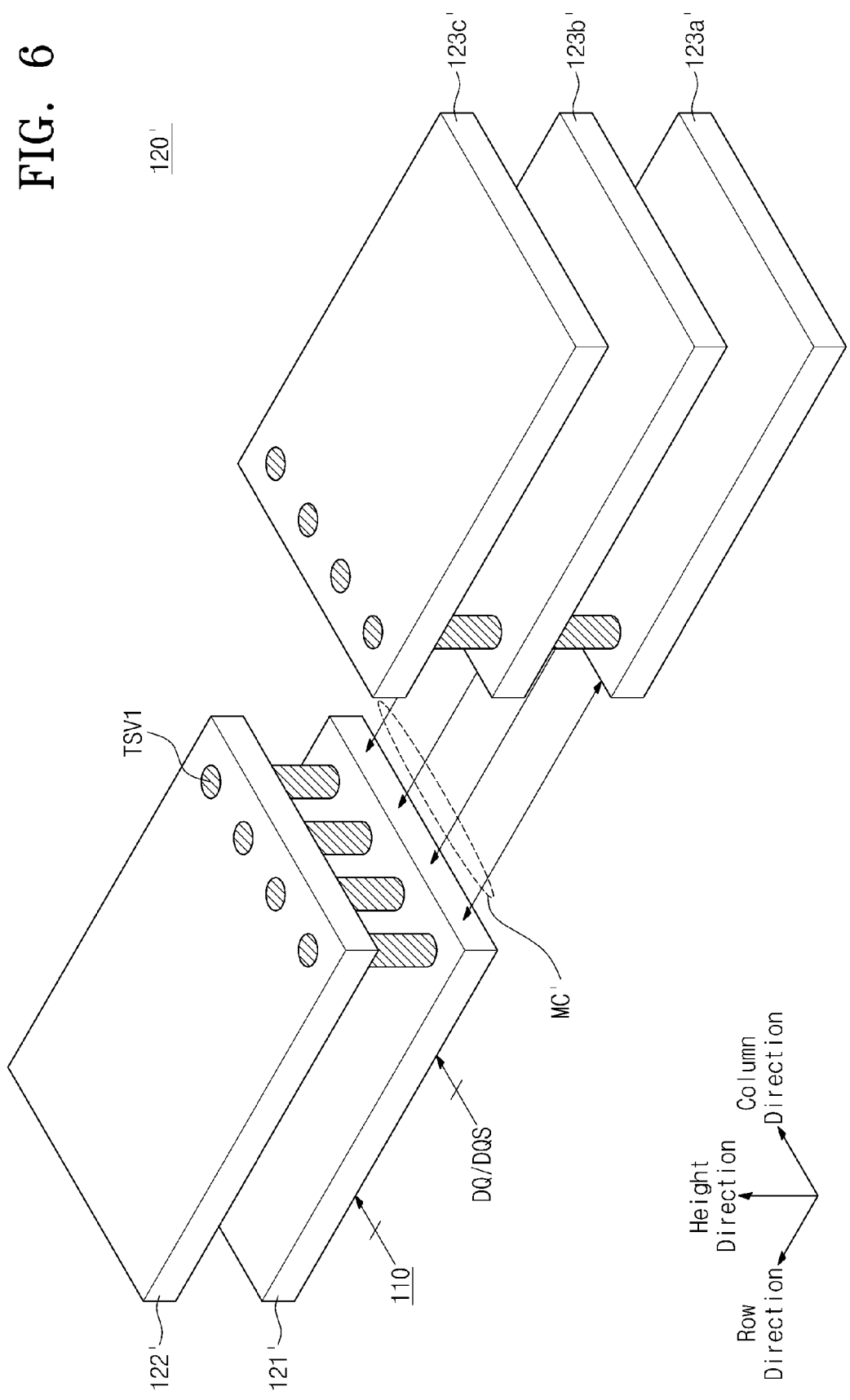
FIG. 6 is a perspective view illustrating an exemplary memory package such as illustrated in FIG. 5, according to certain embodiments.

FIG. 5 is a block diagram illustrating a memory package such as illustrated in FIG. 2, according to another embodiment of the inventive concept. FIG. 6 is a perspective view illustrating a memory package illustrated in FIG. 5. Referring to FIGS. 5 and 6, a memory package 120' may include a logic chip 121', a volatile memory chip 122', and a first to third nonvolatile memory chips 123a' to 123c'. The logic chip 121', the volatile memory chip 122', and the first to third nonvolatile memory chips 123a' to 123c' are described with reference to FIGS. 3 and 4, and thus a detailed description thereof may be omitted.

The logic chip 121' and the volatile memory chip 122' may be stacked in a direction perpendicular to a plane defined along a row direction and a column direction (e.g., a row direction and column direction of memory cells of the memory chips, in some embodiments), and may connected to each other through a first set of through substrate vias TSV1. The first to third nonvolatile memory chips 123a' to 123c' may be stacked in a direction perpendicular to a plane defined along a row direction and a column direction and may connected to each other through a second set of through substrate vias.

As such, the logic chip 121', the volatile memory chip 122', and the first to third nonvolatile memory chips 123a' to 123c' may be stacked on different areas from each other, such that they are horizontally spaced apart from each other. However, they may be part of the same package, as they share a package substrate and may be covered by the same insulative encapsulant. The logic chip 121' and the first to third nonvolatile memory chips 123a to 123c' may be connected to each other through a separate migration channel MC'. In example embodiments, the migration channel MC' may be a separate signal line (e.g., conductive lines included in the package substrate).

Embodiments about a structure of the memory package 120 are described with reference to FIGS. 3 and 6, but the scope and spirit of the inventive concept is not limited thereto. A logic chip, a volatile memory chip, and nonvolatile memory chips included in the memory package 120 may be stacked or arranged by other methods (e.g., zig-zag stacking, mesa structures, etc.).

Figure 7:
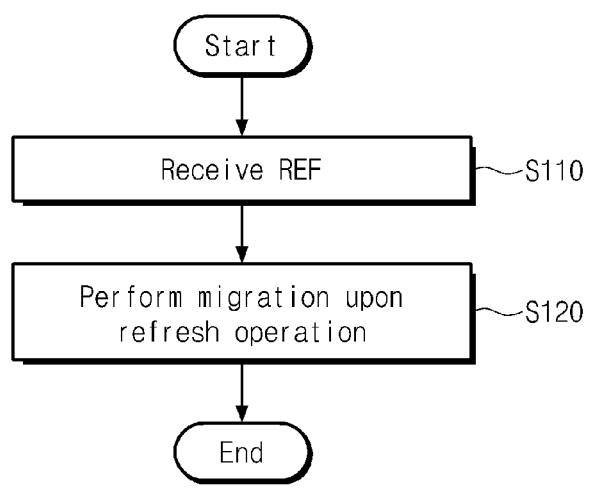
FIG. 7 is a flowchart illustrating an exemplary operation of a memory package illustrated in FIG. 2, according to certain embodiments.

FIG. 7 is a flowchart illustrating an exemplary operation of a memory package such as illustrated in FIG. 2. Referring to FIGS. 2 and 7, in step S110, the memory package 120 may receive a refresh command REF from the RCD 110. For example, the RCD 110 may control the memory package 120 based on a predefined communication protocol. In example embodiments, the predefined communication protocol may be a DRAM-based communication protocol. In example embodiments, a DRAM may periodically perform a refresh operation to maintain stored data. The RCD 110 may periodically transmit the refresh command REF to the memory package 120 such that the memory package 120 performs a refresh operation.

In step S120, when performing a refresh operation in the volatile memory chip in response to the received refresh command REF, the memory package 120 may also perform a migration operation. For example, as described above, the memory package 120 may include the volatile memory chip 122 and the first to third nonvolatile memory chips 123a to 123c. The memory package 120 may perform a refresh operation in response to the received refresh command REF. The refresh operation may denote an operation for reading data stored in the volatile memory chip 122 and rewriting the read data, in order to refresh memory cells in the volatile memory chip 122 that already store data.

When a refresh operation is performed, the memory package 120 may also perform migration procedures for data to be migrated of data stored in the first to third nonvolatile memory chips 123a to 123c. In example embodiments, the data to be migrated may be data having the high possibility to be accessed by the processor 101, having an access frequency greater than or equal to a constant level, being hot data, or having a specific type, from among data stored in the first to third nonvolatile memory chips 123a to 123c. In example embodiments, the data to be migrated may be determined by the migration managing unit MMU of the logic chip 121.

Figure 8:
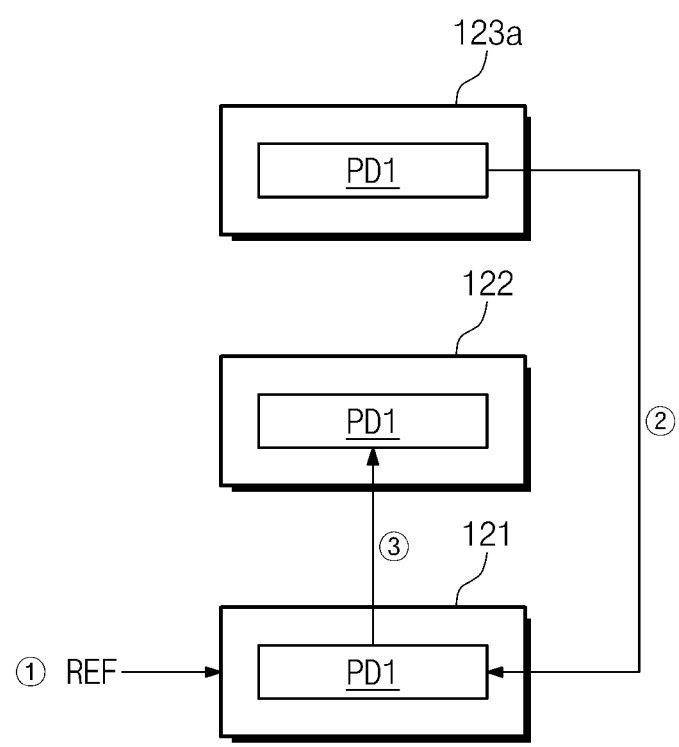
FIG. 8 is a block diagram for describing an exemplary operation illustrated in FIG. 7, according to certain embodiments.

FIG. 8 is a block diagram for describing an operation illustrated in FIG. 7. For the sake of brevity, components which are unnecessary to describe an operation illustrated in FIG. 7 may be omitted. Moreover, it is assumed that first page data PD1 is data to be migrated determined by the migration managing unit MMU.

Referring to FIGS. 2, 7, and 8, the memory package 120 may include the logic chip 121, the volatile memory chip 122, and the nonvolatile memory chip 123a. The logic chip 121 may receive a refresh command REF from the external device (e.g., via an RCD 110 of the logic chip 121) (①). In response to the received refresh command REF, the logic chip 121 may control the volatile memory chip 122 such that the volatile memory chip 122 performs a refresh operation. The volatile memory chip 122 may perform a refresh operation under control of the logic chip 121.

When the refresh operation is performed, the logic chip 121 may also read the first page data PD1 from the nonvolatile memory chip 123a (②). In example embodiments, the first page data PD1 may be data that is selected as data to be migrated by the migration managing unit MMU of the logic chip 121. For example, the migration managing unit MMU may include information about which data of the nonvolatile memory chip 123a are pre-determined to be migrated to the volatile memory chip 122, for example, because they are frequently accessed data.

When the refresh operation is performed, in addition to controlling refresh of existing data in the volatile memory chip 122, the logic chip 121 may control the volatile memory chip 122 such that the read first page data PD1 from nonvolatile memory chip 123a (e.g., frequently accessed data) is written in the volatile memory chip 122 (③). For example, the volatile memory chip 122 may perform a refresh operation under control of the logic chip 121. The refresh operation may include reading data of a specific row and rewriting the read data to the same specific row. While preforming the rewriting, the logic chip 121 may additionally control the volatile memory chip 122 such that the first page data PD1 is written in the volatile memory chip 122.

In example embodiments, the specific row may denote a row corresponding to a refresh address. In addition, a migration address of the volatile memory chip 122 may be selected by the logic chip 121 or the volatile memory chip 122. To write the first page data PD1 in the volatile memory chip 122, the logic chip 121 may select the migration address, for example, as an address of a row, in which data is not stored, from among a plurality of rows included in the volatile memory chip 122.

As described above, the memory package 120 may perform a migration operation during a refresh operation about the volatile memory chip 122. As a result, because an overhead due to a migration operation is reduced, the memory module 100 having increased capacity may be provided without a decrease in performance. Accordingly, the memory module and the memory package having a reduced cost and an improved performance may be provided.

Figure 9:
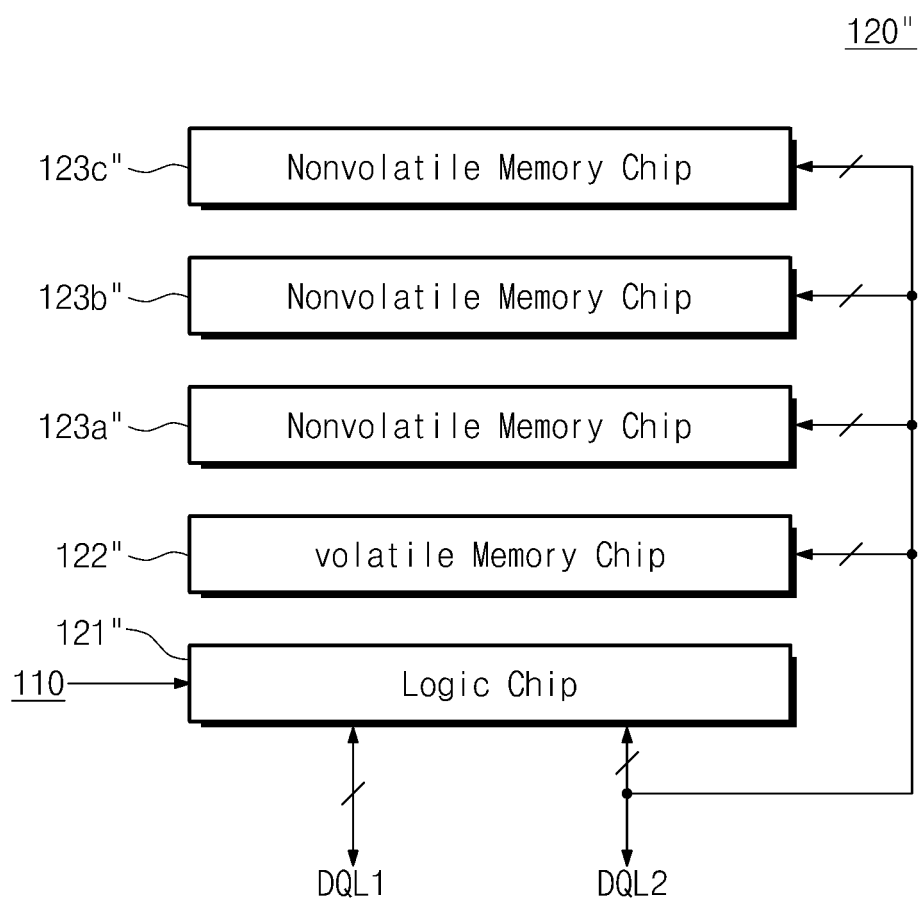
FIG. 9 is a block diagram illustrating an exemplary memory package such as illustrated in FIG. 2, according to certain embodiments of the inventive concept.

FIG. 9 is a block diagram illustrating a memory package illustrated in FIG. 2, according to another embodiment of the inventive concept. Referring to FIGS. 2 and 9, a memory package 120" may include a logic chip 121", a volatile memory chip 122", and first to third nonvolatile memory chips 123a" to 123c". The logic chip 121", the volatile memory chip 122", and the first to third nonvolatile memory chips 123a" to 123c" are described with reference to FIG. 3, and thus a detailed description thereof may be omitted.

Compared with the memory packages 120 and 120' illustrated in FIGS. 3 to 6, the memory package 120" illustrated in FIG. 9 may use a data signal line as a migration channel. For example, the logic chip 121" may include a first data signal line DQL1 and a second data signal line DQL2. In example embodiments, each of the first and second data signal lines DQL1 and DQL2 may include a plurality of signal lines (e.g., a plurality of conductive lines).

The logic chip 121" may use signal lines, which are not used to exchange data with an external device (e.g., processor 101), from among the first and second data signal lines DQL1 and DQL2, as a migration channel. For example, the logic chip 121" may receive a data signal DQ and a data strobe signal DQS from the processor 101 through the first data signal line DQL1. The logic chip 121" may exchange data from the first to third nonvolatile memory chips 123a" to 123c" through the second data signal line DQL2. Therefore, the logic chip 121" may use the second data signal line DQL2 as the migration channel.

Figure 10:
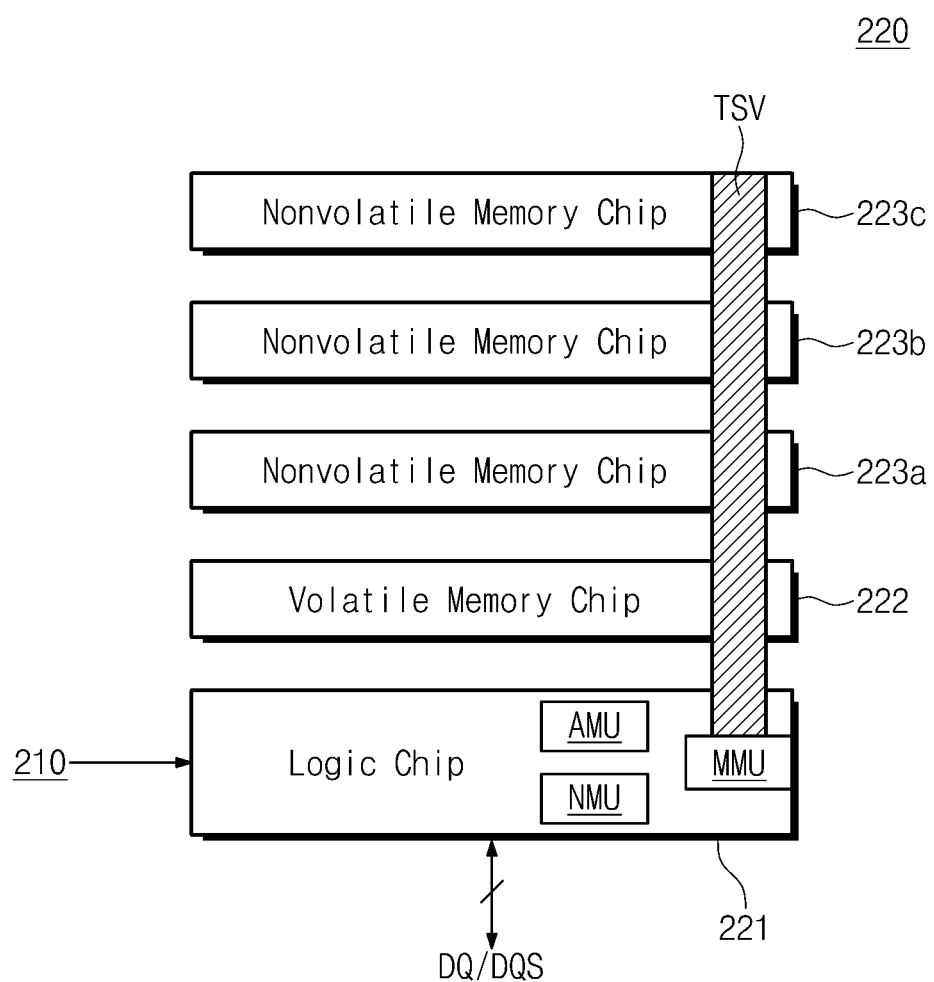
FIG. 10 is a block diagram illustrating an exemplary memory package according to certain embodiments of the inventive concept.

FIG. 10 is a block diagram illustrating a memory package according to another embodiment of the inventive concept. For the sake of brevity, a description overlapped with an above-described component may be omitted. Referring to FIG. 10, the memory package 220 may include a logic chip 221, a volatile memory chip 222, and first to third nonvolatile memory chips 223a to 223c. As described above, components of the memory package 220 may be stacked in a direction perpendicular to a plane and may be connected to each other through a through silicon via TSV. In example embodiments, the through silicon via TSV may be used as a migration channel MC. The logic chip 221, the volatile memory chip 222, and the first to third nonvolatile memory chips 223a to 223c are described with reference to FIGS. 2 to 9, and thus a detailed description thereof may be omitted.

The logic chip 221 may include a migration managing unit MMU, a nonvolatile memory managing unit NMU, and an address managing unit AMU. The migration managing unit MMU is described above, and thus a detailed description thereof may be omitted.

The nonvolatile memory managing unit NMU may be configured to control the first to third nonvolatile memory chips 223a to 223c. For example, the nonvolatile memory managing unit NMU may generate a command, an address, a control signal, and the like for controlling the first to third nonvolatile memory chips 223a to 223c. The nonvolatile memory managing unit NMU may perform an address translation operation, a garbage collection operation, and a wear leveling operation with respect to the first to third nonvolatile memory chips 223a to 223c. In example embodiments, the nonvolatile memory managing unit NMU may control the first to third nonvolatile memory chips 223a to 223c through the through silicon via TSV used as the migration channel MC. Alternatively, the nonvolatile memory managing unit NMU may control the first to third nonvolatile memory chips 223a to 223c through separate signal lines.

The address managing unit AMU may manage addresses of the volatile memory chip 222 and the first to third nonvolatile memory chips 223a to 223c. For example, an external device (e.g., processor 101 illustrated in FIG. 1) may recognize the volatile memory chip 222 and the first to third nonvolatile memory chips 223a to 223c in the memory package 220 as one storage area. That is, an external device may recognize the memory package 220 as one working memory. Here, an external device may provide a command CMD and an address ADDR to the RCD 210 to read data written in the memory package 220. The memory package 220 may output data corresponding to the address ADDR under control of the RCD 210.

In example embodiments, an external device may not recognize a migration operation of the memory package 220 but may recognize the volatile memory chip 222 and the first to third nonvolatile memory chips 223a to 223c as one address area. Accordingly, when data corresponding to a received address ADDR is migrated from the first to third nonvolatile memory chips 223a to 223c to the volatile memory chip 222, a normal operation may be not performed, or an operating performance may be reduced.

In example embodiments, the address ADDR corresponding to the migrated data is received, the address managing unit AMU may manage an address to be accessed to the volatile memory chip 222. Accordingly, when the migrated data is accessed, data may be outputted from the volatile memory chip 222, and thus an operating performance may be improved.

In example embodiments, although not illustrated in FIG. 10, the volatile memory chip 222 may receive the command CMD, the address ADDR, and the clock CK from the RCD 210 and may operate in response to received signals.

Figure 11:
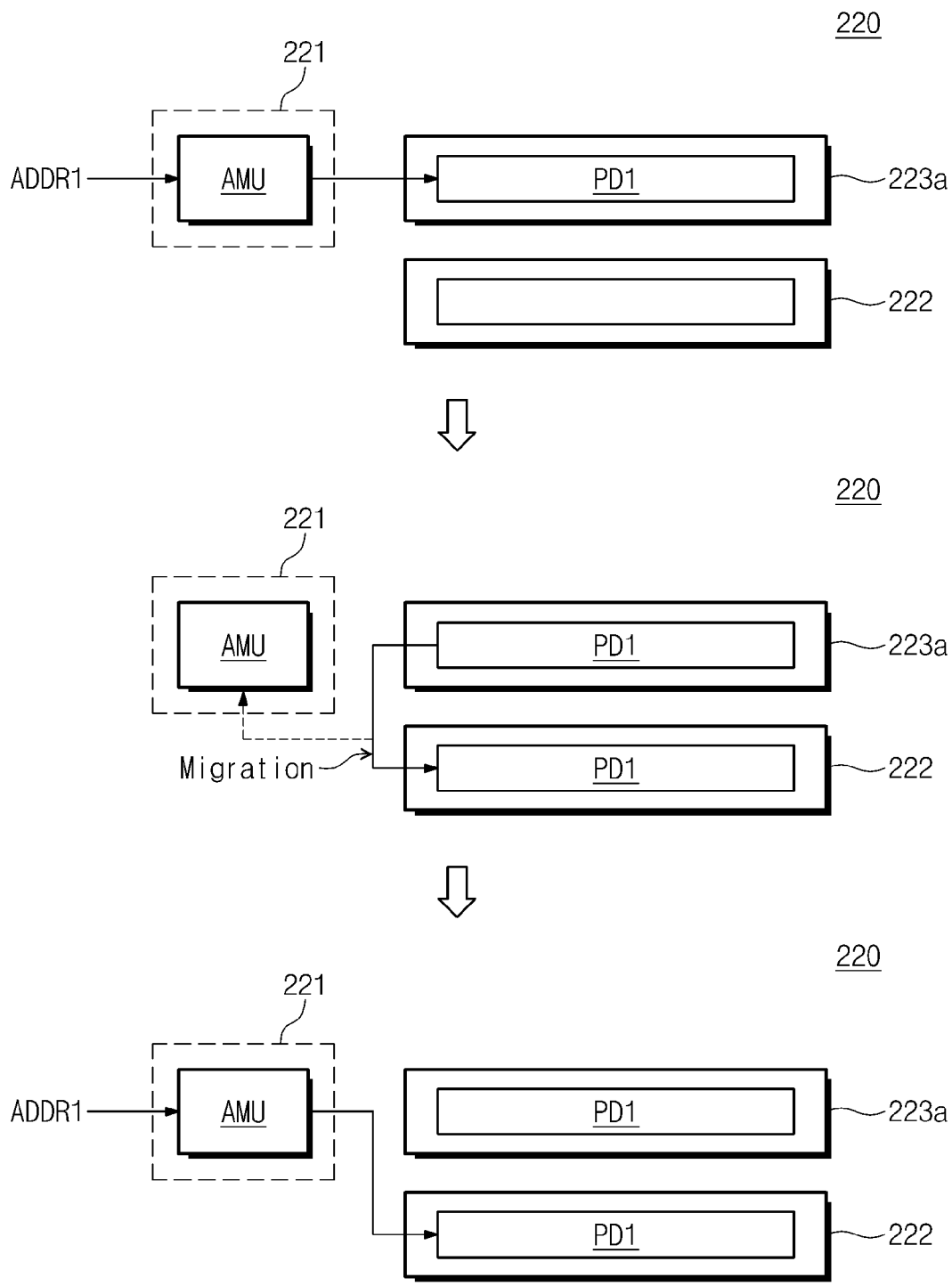
FIG. 11 is a block diagram for describing an exemplary operation of a memory package such as illustrated in FIG. 10, according to certain embodiments.

FIG. 11 is a block diagram for describing an operation of a memory package illustrated in FIG. 10. In example embodiments, an operation of an address managing unit AMU will be intensively described with reference to FIG. 11. For the sake of brevity, components which are unnecessary to describe an operation of the address managing unit AMU may be omitted. Moreover, a description about components the same as above-described components may be omitted.

Referring to FIGS. 10 and 11, the memory package 220 may include the logic chip 221, the volatile memory chip 222, and the first nonvolatile memory chip 223a.

The memory package 220 may receive a first address ADDR1 and may access data corresponding to the received first address ADDR1. For example, the data corresponding to the first address ADDR1 may be first page data PD1. The first page data PD1 may be stored in the first nonvolatile memory device 223a. Here, the address managing unit AMU may provide the first address ADDR1 to the first nonvolatile memory chip 223a such that the first page data PD1 is read from the first nonvolatile memory chip 223a.

After that, the first page data PD1 stored in the first nonvolatile memory chip 223a may be migrated to the volatile memory chip 222. For example, as described above, the memory package 220 may select the first page data PD1, which is stored in the first nonvolatile memory chip 223a, as data to be migrated. The memory package 220 may migrate the first page data PD1 stored in the first nonvolatile memory chip 223a to the volatile memory chip 222 during a refresh operation.

Here, the address managing unit AMU of the memory package 220 may manage an address corresponding to the migrated first page data PD1. For example, after the first page data PD1 is migrated, when the first address ADDR1 corresponding to the migrated first page data PD1 is received, the address managing unit AMU may provide the first address ADDR1 to the volatile memory chip 222 such that the first page data PD1 stored in the volatile memory chip 222 is outputted.

As described above, when specific page data is migrated, the address managing unit AMU may manage or convert a received address such that the specific page data is outputted from the volatile memory chip 222.

Figure 12:
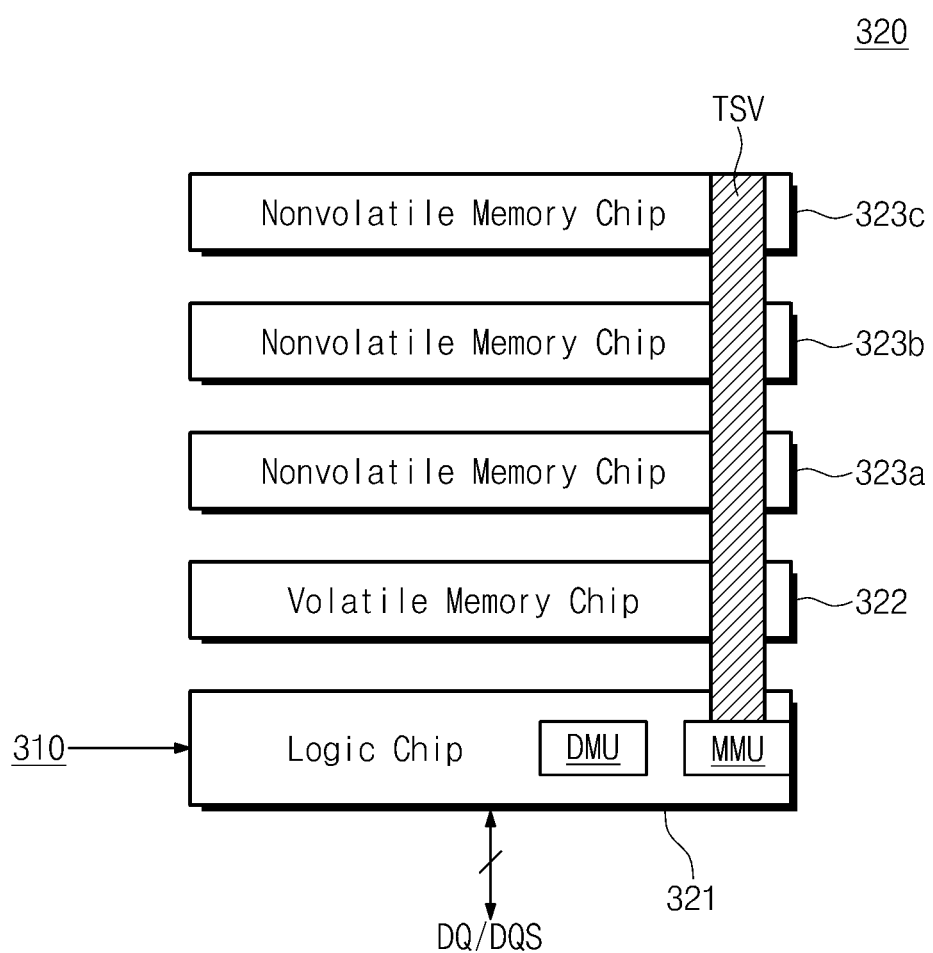
FIG. 12 is a block diagram illustrating an exemplary memory package according to certain embodiments of the inventive concept.

FIG. 12 is a block diagram illustrating a memory package according to still another embodiment of the inventive concept. Referring to FIG. 12, a memory package 320 may include a logic chip 321, a volatile memory chip 322, and a first to third nonvolatile memory chips 323a to 323c. An RCD 310 may control the memory package 320 under control of the processor 101 as illustrated in FIGS. 1 and 2 above. The logic chip 321 may include a migration managing unit MMU and a data managing unit DMU. The logic chip 321, the volatile memory chip 322, and the first to third nonvolatile memory chips 323a to 323c are described above, and thus a detailed description thereof may be omitted.

The data managing unit DMU may manage data received from an external device (e.g., processor). For example, the data managing unit DMU may determine an attribute of received data. The data managing unit DMU may selectively write data in the volatile memory chip 322 or the first to third nonvolatile memory chips 323a to 323c based on the determined attribute.

For example, when the received data is hot data, the data managing unit DMU may set an address such that the received data is written in the volatile memory chip 322. Alternatively, when the received data is cold data, the data managing unit DMU may set an address such that the received data is written in the first to third nonvolatile memory chips 323a to 323c. In example embodiments, the data managing unit DMU may determine whether the received data is hot data or cold data, based on a data size, a type of data, header information of data, and the like.

Figure 13:
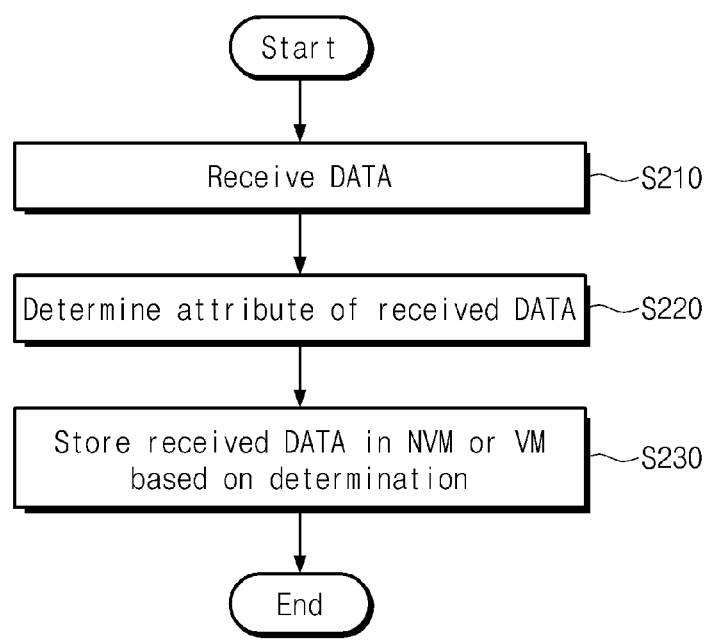
FIG. 13 is a flowchart for describing an exemplary operation of a data managing unit DMU illustrated in FIG. 12, according to certain embodiments.

FIG. 13 is a flowchart for describing an operation of a data managing unit DMU illustrated in FIG. 12. Referring to FIGS. 12 and 13, in step S210, the data managing unit DMU may receive data from an external device (e.g., processor). For example, as described above, the data managing unit DMU may receive data from an external device through a data signal DQ and a data strobe signal DQS.

In step S220, the data managing unit DMU may determine an attribute of the received data. For example, the data managing unit DMU may determine whether the received data is hot data or cold data, based on a data size, a type of data, header information of data, and the like.

In step S230, the data managing unit DMU may store the received data in a volatile memory chip or a nonvolatile memory chip based on the determined result. For example, when the received data is hot data, the data managing unit DMU may convert an address corresponding to the received data such that the received data is written in the volatile memory chip 322. When the received data is cold data, the data managing unit DMU may convert an address corresponding to the received data such that the received data is written in the first to third nonvolatile memory chips 323a to 323b. In example embodiments, although not illustrated in FIG. 13, the converted address may be managed by the address managing unit AMU described with reference to FIG. 10.

In example embodiments, the data managing unit DMU may manage hot data of data stored in nonvolatile memory chips. For example, the data stored in nonvolatile memory chips may be cold data. However, there may be data, of which a type is changed into hot data, from among the data stored in nonvolatile memory chips based on an access frequency to a memory package. Here, the data managing unit DMU may manage access to nonvolatile memory chips and may determine data, of which a type is changed into hot data, from among the data stored in nonvolatile memory chips. In example embodiments, data, of which a type is changed into hot data, from among the data stored in nonvolatile memory chips may be migrated to a volatile memory chip through a migration operation.

As described above, a memory package may store received data in a volatile memory chip or a nonvolatile memory chip based on an attribute of the received data. That is, hot data of which an access frequency is high may be stored in a volatile memory chip having a fast operating speed, and cold data of which an access frequency is low may be stored in a nonvolatile memory chip having a relatively slow operating speed, thereby maintaining an access speed and increasing an available memory capacity.

Figure 14:
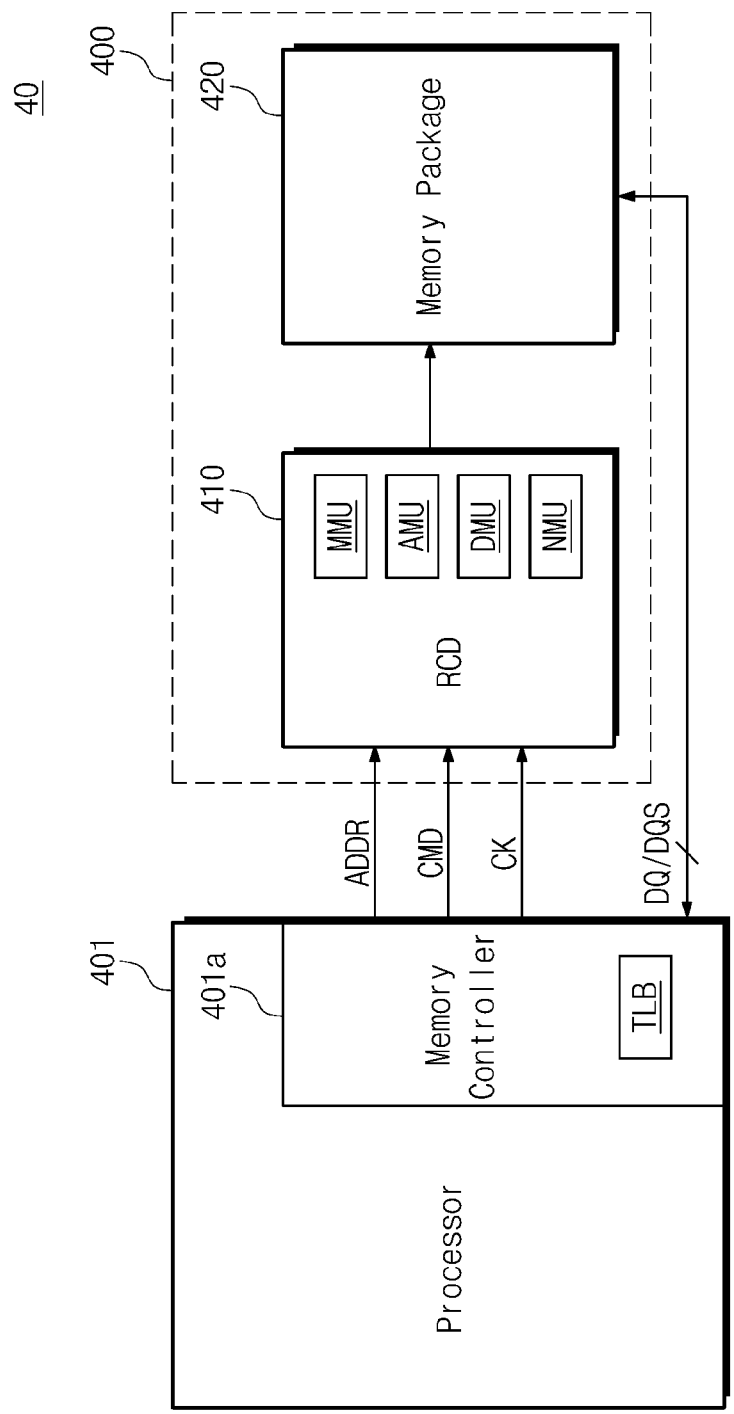
FIG. 14 is a block diagram illustrating an exemplary user system according to certain embodiments of the inventive concept.

FIG. 14 is a block diagram illustrating a user system according to still another embodiment of the inventive concept. Referring to FIG. 14, a user system 40 may include a processor 401 and a memory module 400. The processor 401 may include a memory controller 401a. The memory controller 401a may be configured to control the memory module 400. For example, the memory controller 401a may transmit an address ADDR, a command CMD, and a clock CK for controlling the memory module 400 to the memory module 400. The memory controller 401a may exchange data with the memory module 400 through a data signal DQ and a data strobe signal DQS.

The memory module 400 may include a RCD 410 and a memory package 420. The RCD 410 and the memory package 420 are described above, and thus a detailed description thereof may be omitted. In example embodiments, the RCD 410 illustrated in FIG. 14 may include the migration managing unit MMU, the address managing unit AMU, the data managing unit DMU, or the nonvolatile memory managing unit NMU described above.

For example, a memory package described with reference to FIGS. 1 to 13 may operate under control of a logic chip including the migration managing unit MMU, the address managing unit AMU, the data managing unit DMU, or the nonvolatile memory managing unit NMU.

However, the RCD 410 illustrated in FIG. 14 may include the migration managing unit MMU, the address managing unit AMU, the data managing unit DMU, or the nonvolatile memory managing unit NMU, may control a migration operation, an address conversion operation, and a data managing operation of a memory package, which are described above, and may generate various types of control signals for controlling nonvolatile memory chips. That is, the memory package 420 may include a volatile memory chip and a nonvolatile memory chip and may operate under control of the RCD 410.

In example embodiments, the memory controller 401a may include a translation lookaside buffer TLB. The translation lookaside buffer TLB may include address information or index information about data stored in a memory module 400. For example, the processor 401 may scan the translation lookaside buffer TLB to determine whether data to be accessed is in the memory module 400. When the data to be accessed is not in the memory module 400, the processor 401 may read the data to be accessed from other storage medium. When the data to be accessed is in the memory module 400, the memory controller 401a may provide the corresponding address ADDR to the memory module 400. The memory module 400 may output data corresponding to the received address ADDR.

In example embodiments, when a migration operation is performed in the memory package 420 of the memory module 400, the translation lookaside buffer TLB may be updated based on data migration result. For example, when first page data is migrated from a nonvolatile memory device to a volatile memory device, the memory module 400 may update the translation lookaside buffer TLB such that the first page data corresponds to the volatile memory device.

In example embodiments, a portion of bit(s) (e.g., most significant bit (MSB)) of the address ADDR selected by the translation lookaside buffer TLB may be information for indicating at least one of a volatile memory chip and nonvolatile memory chips in the memory package 420. Here, the RCD 410 may control at least one of a volatile memory chip and nonvolatile memory chips in the memory package 420 based on a MSB of the address ADDR.

In example embodiments, in FIG. 14, the RCD 410 may include the migration managing unit MMU, the address managing unit AMU, the data managing unit DMU, or the nonvolatile memory managing unit NMU. For example, the migration managing unit MMU, the address managing unit AMU, the data managing unit DMU, and the nonvolatile memory managing unit NMU may be respectively included in the processor 401, the memory controller 401a, the RCD 410, and the memory package 420 or may be implemented with a separate control circuit.

Figure 15:
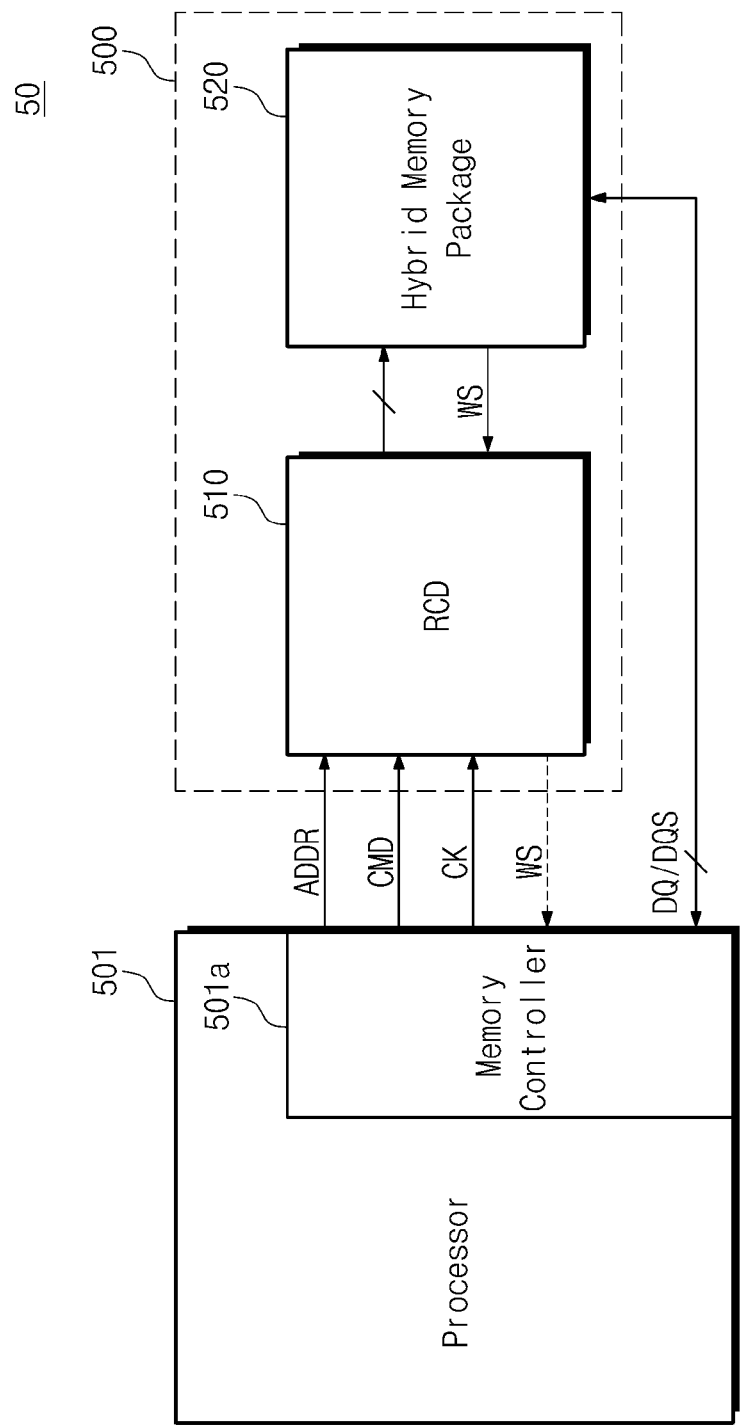
FIG. 15 is a block diagram illustrating an exemplary user system according to certain embodiments of the inventive concept.

FIG. 15 is a block diagram exemplarily illustrating a user system according to still another embodiment of the inventive concept. Referring to FIG. 15, a user system 50 may include a processor 501 and a memory module 500. The processor 501 may include a memory controller 501a. The memory module 500 may include a RCD 510 and a memory package 520. The processor 501, the memory controller 501a, the memory module 500, the RCD 510, and the memory package 520 are described above, and thus a detailed description thereof may be omitted.

The memory package 520 may output a waiting signal WS to the RCD 510. The waiting signal WS may be a signal for indicating that the memory package 520 is ready to be accessed. For example, as described above, the memory package 520 may include a volatile memory chip and a nonvolatile memory chip. An access speed or an operating speed of the nonvolatile memory chip may be slower than that of the volatile memory chip. The RCD 510 may control the memory package 520 based on a predefined communication protocol. In example embodiments, the predefined communication protocol may be a communication protocol based on a volatile memory chip. That is, when a nonvolatile memory chip having a slow operating speed is accessed, the memory module may not normally operate.

When an access to a nonvolatile memory chip is performed, the memory package 520 may transmit the waiting signal WS, which is a signal for indicating that the nonvolatile memory chip is ready to be accessed, to the RCD 510. The RCD 510 may access the nonvolatile memory chip included in the memory package 520 in response to the waiting signal WS. In example embodiments, the RCD 510 may provide the waiting signal WS to the memory controller 501a. The memory controller 501a may access memory module 500 in response to the waiting signal WS.

In example embodiments, the memory controller 501a of the processor 501 may recognize the memory module 500 as one address area. For example, the memory controller 501a of the processor 501 may include a volatile memory chip and a nonvolatile memory chip. The memory controller 501a may manage the volatile memory chip and the nonvolatile memory chip as one address area without distinction between the volatile memory chip and the nonvolatile memory chip. Here, the processor 501 may not recognize whether data to be accessed is stored in the volatile memory device or the nonvolatile memory device. That is, the processor 501 may not control the memory module 500 normally.

When the nonvolatile memory chip is accessed, the memory module 500 according to an embodiment may provide the waiting signal WS to the processor 501 and may inform the processor 501 that an access to a nonvolatile memory chip is ready. The processor 501 may normally access data stored in the nonvolatile memory chip in response to the waiting signal WS.

As described above, the memory package of the memory module according to an embodiment of the inventive concept may migrate data from the nonvolatile memory chip to the volatile memory chip during a refresh operation. Moreover, the memory package may include stacked volatile memory chip and nonvolatile memory chips and may perform a migration operation through a through silicon via TSV. The memory package may manage a migrated address. The memory package may manage received data. As described above, according to an embodiment of the inventive concept, a memory module having increased storage capacity and an improved performance may be provided.

In example embodiment, each of the migration managing unit MMU, the address managing unit AMU, the data managing unit DMU, or the nonvolatile memory managing unit NMU may be implemented with hardware or software.

Figure 16:
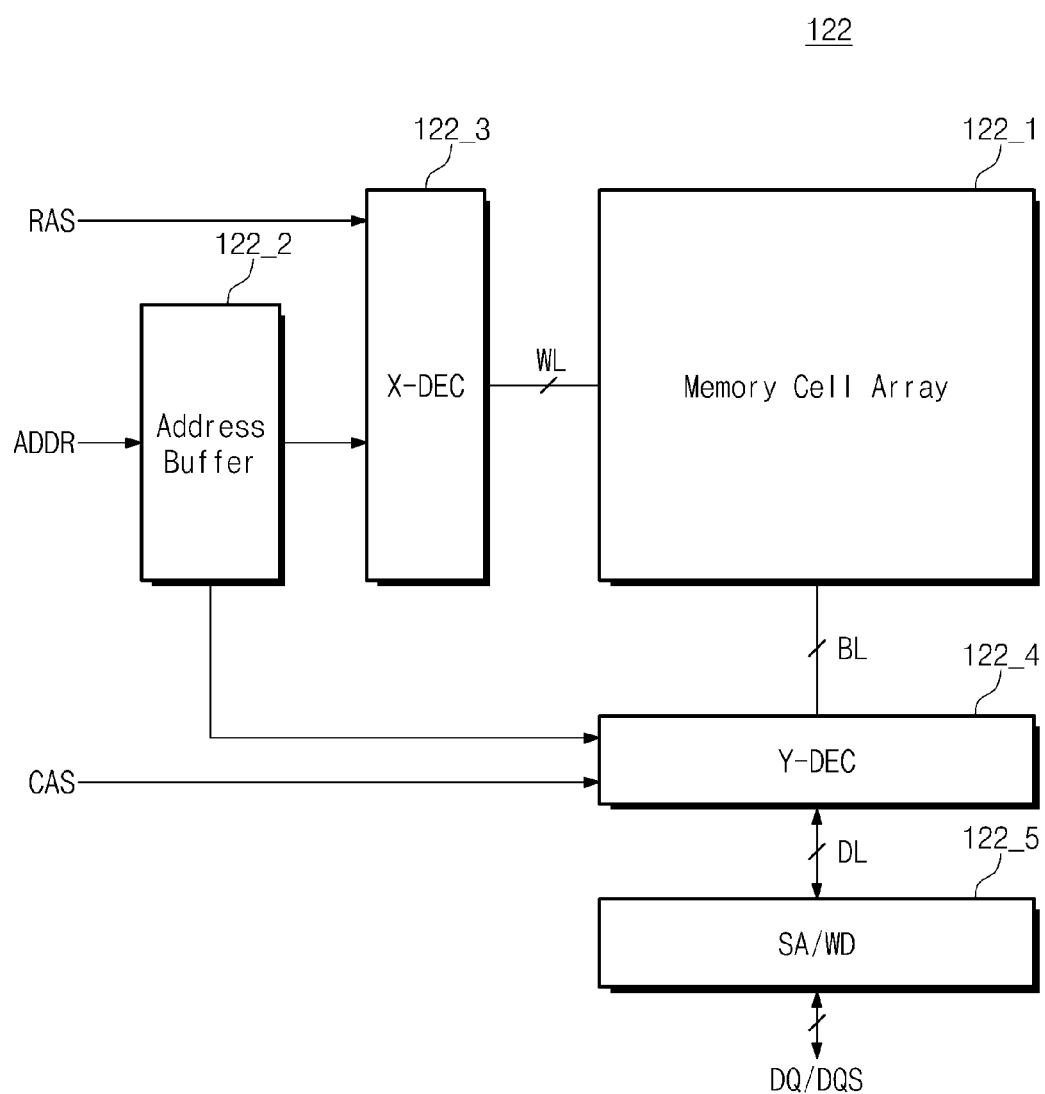
FIG. 16 is a block diagram exemplarily illustrating an exemplary volatile memory chip such as illustrated in FIG. 3, according to certain embodiments.

FIG. 16 is a block diagram exemplarily illustrating a volatile memory chip illustrated in FIG. 3. In example embodiment, it is assumed that the volatile memory chip 122 is, but not limited to, a DRAM.

Referring to FIG. 16, the volatile memory chip 122 may include a memory cell array 122_1, an address buffer 122_2, an X-decoder 122_3, a Y-decoder 122_4, and a sense amplifier and write driver block 122_5.

The memory cell array 122_1 may include a plurality of memory cells. The memory cells may be arranged at intersections of a plurality of word lines WL and a plurality of bit lines BL, respectively. The memory cells may be connected to the word lines WL and the bit lines BL. Each of the memory cells may include a capacitor and a transistor.

The address buffer 122_2 may receive the address ADDR from an external device (e.g., logic chip or RCD) and may buffer the received address ADDR. The address buffer 122_2 may provide the received address ADDR to the X-decoder 122_3 or the Y-decoder 122_4.

The X-decoder 122_3 may receive a row control command RAS from an external device (e.g., logic chip or RCD) and may activate at least one of the word lines in response to received signals. In example embodiment, the X-decoder 122_3 may receive a row address (ADDR row) from the address buffer 122_2, and the activated word line may be a word line corresponding to the received row address.

The Y-decoder 122_4 may receive a column control command CAS from an external device (e.g., logic chip or RCD) and may activate at least one of the bit lines in response to received signals. In example embodiment, the Y-decoder 122_4 may receive a column address (ADDR_col) from the address buffer 122_2, and the activated bit line may be a bit line corresponding to the received column address.

The sense amplifier and write driver block 122_5 may be connected to the Y-decoder 122_4 through a plurality of data lines DL. The sense amplifier and write driver block 122_5 may sense (or detect) fluctuations in a voltage of the data lines DL to amplify and output the fluctuations in a voltage or may control voltages of the data lines DL based on data received through a data signal DQ and a data strobe signal DQS.

Figure 17:
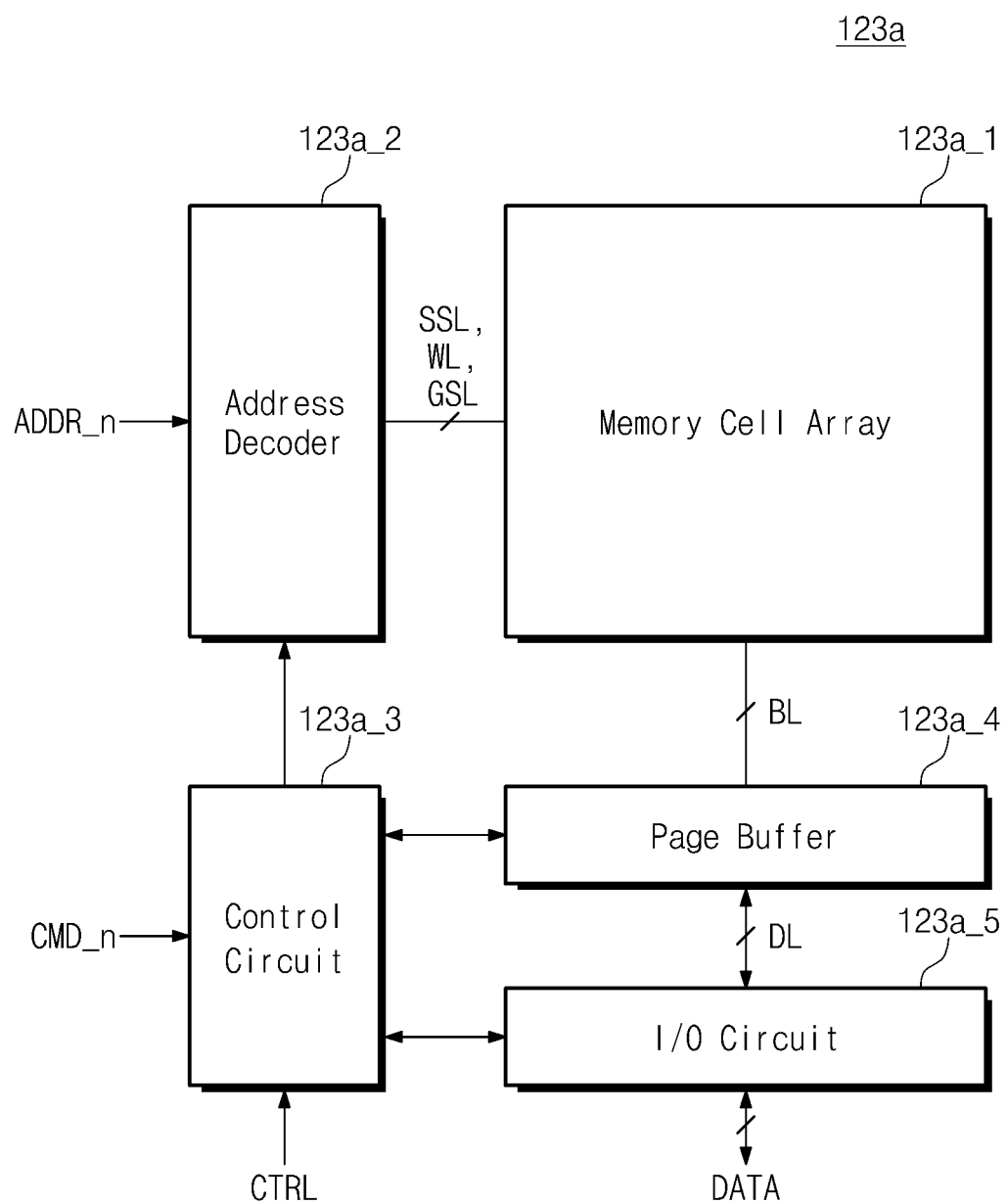
FIG. 17 is a block diagram exemplarily illustrating an exemplary first nonvolatile memory chip of nonvolatile memory chips illustrated in FIG. 3, according to certain embodiments.

FIG. 17 is a block diagram exemplarily illustrating a first nonvolatile memory chip of nonvolatile memory chips illustrated in FIG. 3. Referring to FIG. 17, the first nonvolatile memory chip 123a may include a memory cell array 123a_1, an address decoder 123a_2, a control circuit 123a_3, a page buffer 123a_4, and an input/output circuit 123a_5.

The memory cell array 123a_1 may include a plurality of memory blocks. Each of the memory blocks may include a plurality of cell strings, and each of the cell strings may include a plurality of memory cells. The memory cells may be connected to a plurality of word lines WL. The memory cells may be arranged along a row direction and a column direction and each page may be composed of memory cells.

The address decoder 123a_2 may be connected to the memory cell array 123a_1 through string selection lines SSL, word lines WL, and ground selection lines GSL. The address decoder 123a_2 may receive an address ADDR_n from an external device (e.g., logic chip or RCD) and may decode the received address ADDR_n. The address decoder 123a_2 may select at least one of the word lines WL based on the decoded address and may control the selected word line. In example embodiment, the address ADDR_n may be an address corresponding to the nonvolatile memory chip 123a. The address ADDR_n may be an address converted by the address managing unit AMU (refer to FIG. 10).

The control circuit 123a_3 may receive the command CMD_n and a control signal CTRL from an external device (e.g., logic chip or RCD) and may control the address decoder 123a_2, the page buffer 123a_3, and the input/output circuit 123a_4 in response to received signals. In example embodiment, the module controller 121 may provide the command CMD_n corresponding to a command and the control signal CTRL to the nonvolatile memory device NVM in response to the command CMD_n from the processor 101.

The page buffer 123a_4 may be connected to the memory cell array 123a_1 through a plurality of bit lines BL and may be connected to the input/output circuit 123a_5 through a plurality of data lines DL. The page buffer 123a_4 may control the bit lines BL under control the control circuit 123a_3 such that the data received from the input/output circuit 123a_5 through the data lines DL is stored in the memory cell array 123a_1. The page buffer 123a_4 may read the data stored in the memory cell array 123a_1 under control the control circuit 123a_3.

The input/output circuit 123a_5 may exchange the data with an external device (e.g., logic chip or processor).

In example embodiment of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiment of the inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 18:
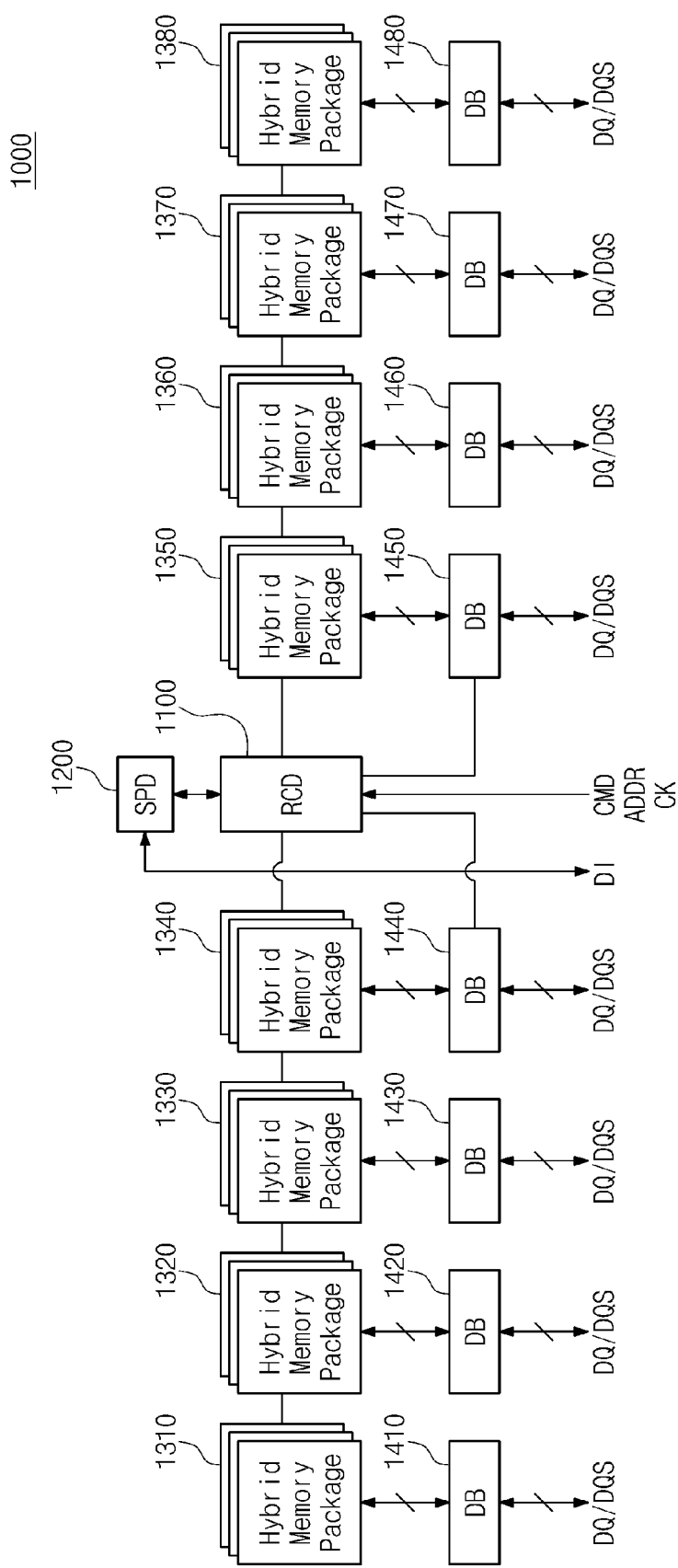
FIG. 18 is a block diagram illustrating an exemplary memory module according to certain embodiments of the inventive concept.

FIG. 18 is a block diagram illustrating a memory module according to an embodiment of the inventive concept. In example embodiments, a memory module 1000 illustrated in FIG. 18 may have a structure of load reduced dual in-line memory module (LRDIMM). The memory module 1000 illustrated in FIG. 18 may be installed on a DIMM socket and may communicate with a processor.

Referring to FIG. 18, the memory module 1000 may include a RCD 1100, a SPD 1200, a plurality of memory packages 1310 to 1380, and a plurality of data buffers 1410 to 1480. In example embodiments, of the RCD 1100, the SPD 1200, and the memory packages 1310 to 1380 are described with reference to FIGS. 1 to 16, and thus a detailed description thereof may be omitted.

Each of the data buffers 1410 to 1480 may be configured to exchange a data signal DQ and a data strobe signal DQS with an external device (e.g., processor). Moreover, the data buffers 1410 to 1480 may be configured to exchange the data signal DQ and the data strobe signal DQS with the memory packages 1310 to 1380, respectively.

In example embodiments, each of the memory packages 1310 to 1380, as described above, may be a hybrid memory package. Moreover, each of the memory packages 1310 to 1380 may operate according to an operation method described with reference to FIGS. 1 to 18.

Figure 19:
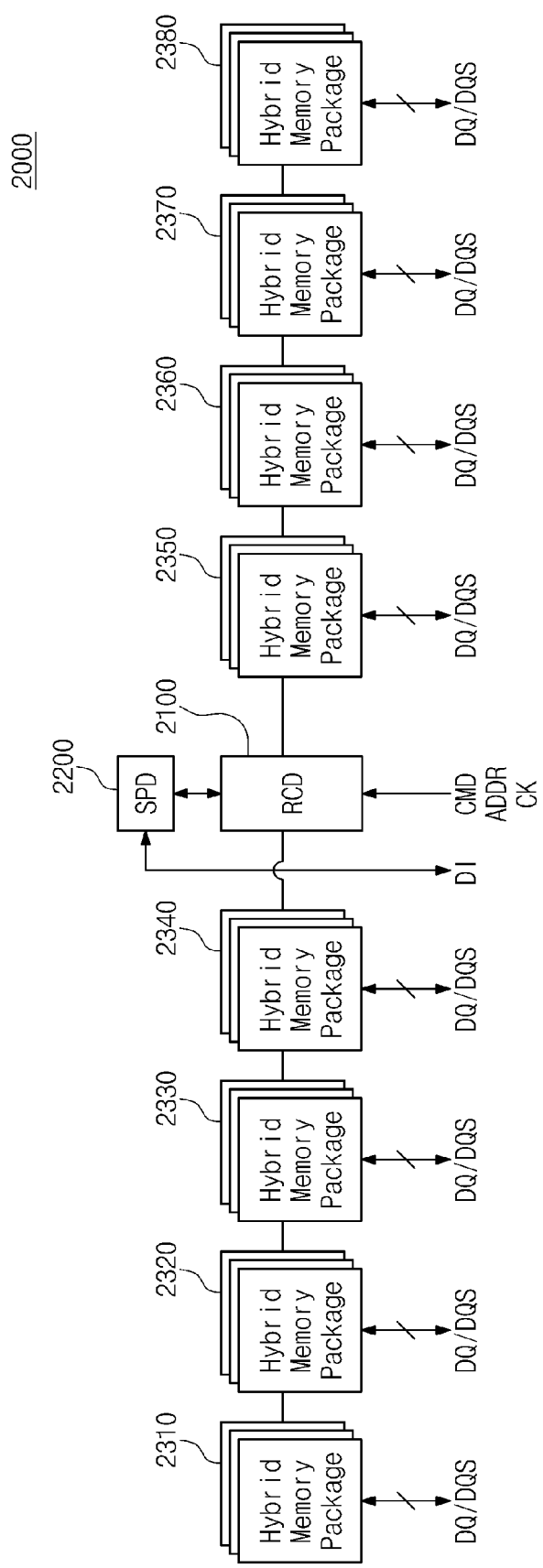
FIG. 19 is a block diagram illustrating an exemplary memory module according to certain embodiments of the inventive concept.

FIG. 19 is a block diagram illustrating a memory module according to another embodiment of the inventive concept. In example embodiments, the memory module 2000 illustrated in FIG. 19 may have a structure of registered dual in-line memory module (RDIMM). The memory module 2000 illustrated in FIG. 19 may be installed on a DIMM socket, and may communicate with a processor.

Referring to FIG. 19, the memory module 2000 may include a RCD 2100, a SPD 2200, and a plurality of memory packages 2310 to 2380. The memory module 2000 illustrated in FIG. 19 may not include a data buffer, compared with the memory module 1000 illustrated in FIG. 18. Each of the memory packages 2310 to 2380 may directly communicate with an external device (e.g., processor) through a data signal DQ and a data strobe signal DQS.

In example embodiments, each of the memory packages 2310 to 2380, as illustrated above, may be a hybrid memory package and may operate according to an operation method described with reference to FIGS. 1 to 16.

Figure 20:
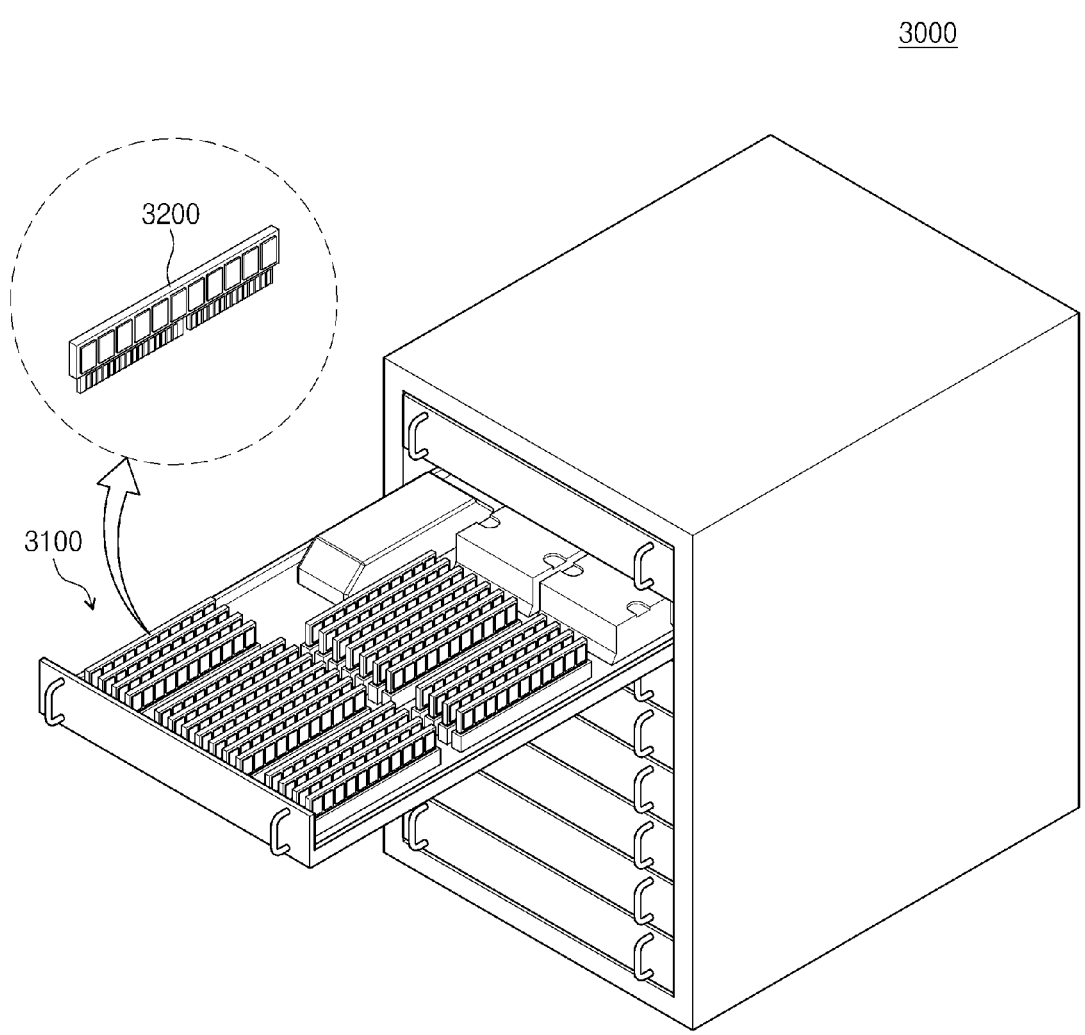
FIG. 20 is a diagram exemplarily illustrating a server system including a memory module according to certain embodiments of the inventive concept.

FIG. 20 is a diagram exemplarily illustrating a server system including a memory module according to an embodiment of the inventive concept. Referring to FIG. 20, a server system 3000 may include a plurality of server racks 3100. Each of the server racks 3100 may include a plurality of memory modules 3200. The memory modules 3200 may be directly connected to processors respectively included in the server racks 3100. For example, the memory modules 3200 may have a form of a dual in-line memory module, may be installed in a DIMM socket electrically connected to a processor, and may communicate with the processor. In example embodiments, the memory modules 3200 may be used as storage or an operating memory of the server system 3000. In example embodiments, the memory modules 3200 may operate according to a method described with reference to FIGS. 1 to 19.

Figure 21:
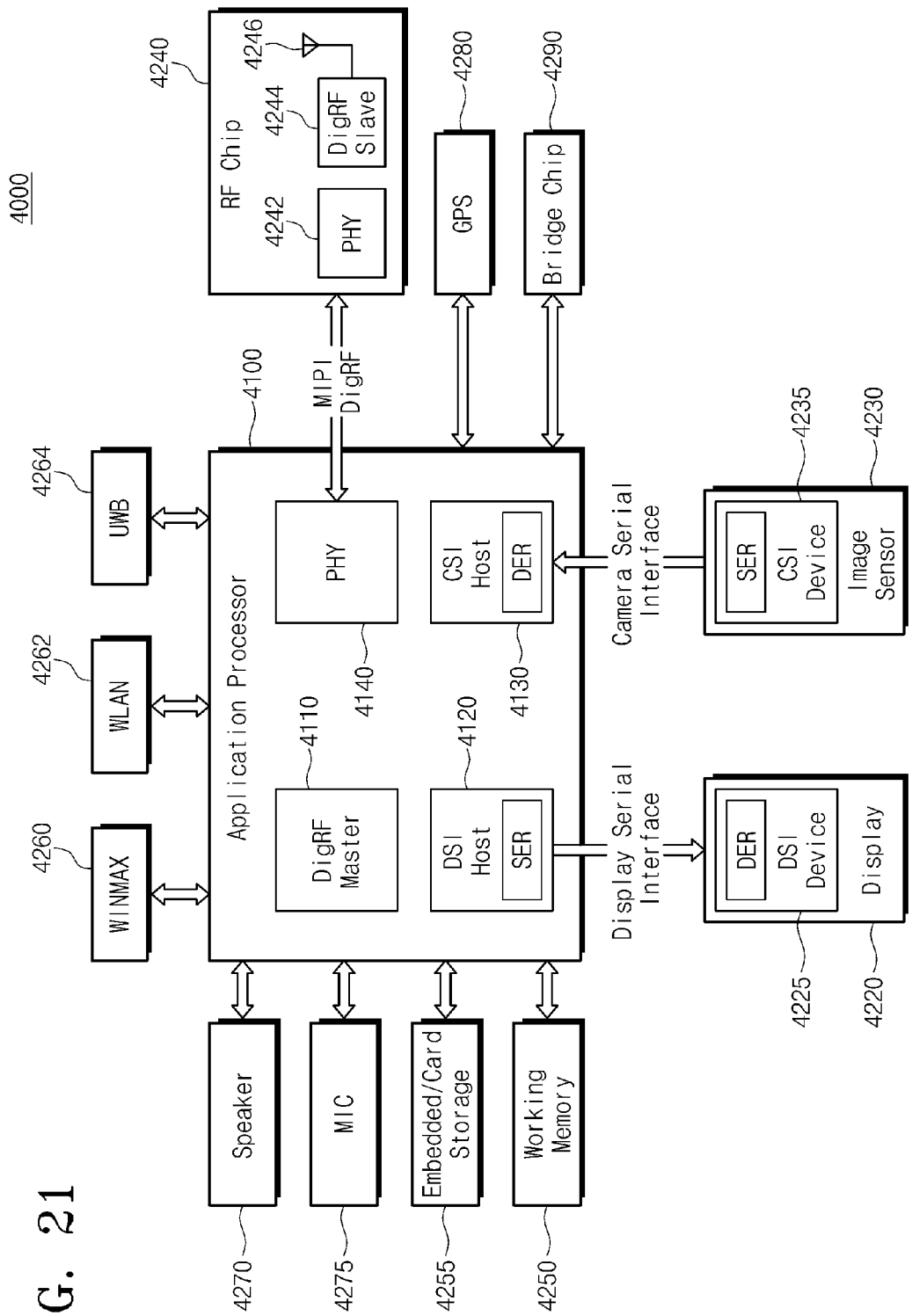
FIG. 21 is a block diagram illustrating an electronic system including a memory module or a memory package according to certain embodiments of the inventive concept.

FIG. 21 is a block diagram illustrating an electronic system including a memory module or a memory package according to an embodiment of the inventive concept. An electronic system 4000 may be implemented with a data processing device capable of using or supporting an interface offered by mobile industry processor interface (MIPI) alliance. For example, the electronic system 4000 may be implemented with a portable communication terminal, a personal digital assistant (PDA), a portable multimedia player (PMP), a smart phone, or a wearable device.

The electronic system 4000 may include an application processor 4100, a display 4220, and an image sensor 4230. The application processor 4100 may include a DigRF master 4110, a display serial interface (DSI) host 4120, a camera serial interface (CSI) host 4130, and a physical layer 4140.

The DSI host 4120 may communicate with a DSI device 4225 of the display 4220 through DSI. For example, an optical serializer SER may be implemented in the DSI host 4120, and an optical deserializer DES may be implemented in the DSI device 4225.

The CSI host 4130 may communicate with a CSI device 4235 of the image sensor 4230 through a CSI. For example, an optical deserializer may be implemented in the CSI host 4130, and an optical serializer may be implemented in the CSI device 4235.

The DSI and CSI may use a physical layer and a link layer. The DSI and CSI may be applied to an embodiment of the inventive concept. For example, the DSI host 4120 and the DSI device 4225 may selectively extract an error log through peer to peer (P2P) communication between a physical layer and a link layer. Alternately, the CSI device 4235 and the CSI host 4130 may selectively extract an error log through P2P communication between a physical layer and a link layer.

The electronic system 4000 may further include a radio frequency (RF) chip 4240 for communicating with the application processor 4100. The RF chip 4240 may include a physical layer 4242, a DigRF slave 4244, and an antenna 4246. For example, the physical layer 4242 of the RF chip 4240 and the physical layer 4140 of the application processor 4100 may exchange data with each other through DigRF interface offered by MIPI alliance.

The electronic system 4000 may further include a working memory 4250 and embedded/card storage 4255. The working memory 4250 and the embedded/card storage 4255 may store data received from the application processor 4100. Moreover, the working memory 4250 and the embedded/card storage 4255 may provide the data stored therein to the application processor 4100. In example embodiments, the working memory 4250 may be a memory module described with reference to FIGS. 1 to 20. In example embodiments, the working memory 4250 may include a plurality of memory packages, and each of the memory packages may include a volatile memory chip and nonvolatile memory chips. Each of the memory packages may perform a migration operation during a refresh operation.

The working memory 4250 may temporarily store data, which was processed or will be processed by the application processor 4100. The working memory 4250 may include a volatile memory chip such as SRAM, DRAM, SDRAM, and the like, and a nonvolatile memory chip such as flash memory, PRAM, MRAM, ReRAM, FRAM, and the like.

The embedded/card storage 4255 may store data regardless of a power supply. In example embodiments, the embedded/card storage 4255 may operate according to universal flash storage (UFS) interface protocol, but not limited thereto. The embedded/card storage 4255 may include a nonvolatile memory device described with reference to FIGS. 1 to 20. The nonvolatile memory device included in the embedded/card storage 4255 may perform a program operation based on a program pass/fail determination method described with reference to FIGS. 1 to 20.

The electronic system 4000 may communicate with an external system through a worldwide interoperability for microwave access (WiMAX) 4260, a wireless local area network (WLAN) 4262, and an ultra-wideband (UWB) 4264, or the like.

The electronic system 4000 may further include a speaker 4270 and a microphone 4275 for processing voice information. The electronic system 4000 may further include a global positioning system (GPS) device 4280 for processing position information. The electronic system 4000 may further include a bridge chip 4290 for managing connections between peripheral devices.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

Embodiments of the inventive concept may provide a memory package, a memory module having the same, and an operating method thereof, which have increased memory capacity and an improved performance.

What is claimed is:

1. A memory package comprising:
   a nonvolatile memory chip;
   a volatile memory chip of which an access speed is faster than an access speed of the nonvolatile memory chip; and
   a logic chip configured to perform a refresh operation on the volatile memory chip in response to a refresh command from an external device and to migrate at least a portion of data stored in the nonvolatile memory chip to the volatile memory chip when the refresh operation is performed,
   wherein both the refresh operation and migration of at least a portion of data stored in the nonvolatile memory chip to the volatile memory chip occur in response to the refresh command.

2. The memory package of claim 1, wherein the logic chip performs a migration operation through a separate migration-dedicated channel.

3. The memory package of claim 1, wherein the nonvolatile memory chip and the volatile memory chip are stacked in a direction perpendicular to the logic chip, and
   wherein the nonvolatile memory chip, the volatile memory chip, and the logic chip are connected to each other through a through silicon via.

4. The memory package of claim 3, wherein the logic chip performs the migration operation through the through silicon via.

5. The memory package of claim 1, wherein the logic chip determines data, being to be migrated, of data stored in the nonvolatile memory chip.

6. The memory package of claim 5, wherein the data to be migrated is data of which an access frequency is above a specific level.

7. The memory package of claim 1, wherein the logic chip comprises:
   a nonvolatile memory managing unit configured to perform a garbage collection operation and a wear leveling operation about the nonvolatile memory chip.

8. The memory package of claim 1, wherein the logic chip comprises:
   an address managing unit configured to manage addresses of the nonvolatile memory chip and the volatile memory chip such that data corresponding to an address received from the external device is outputted.

9. The memory package of claim 8, wherein when data corresponding to the received address is stored in the volatile memory chip, the address managing unit converts the received address such that data stored in the volatile memory chip is outputted.

10. The memory package of claim 1, wherein when the nonvolatile memory chip is accessed, the logic chip transmits a waiting signal, which is a signal for indicating that the nonvolatile memory chip is ready to be accessed, to the external device.

11. The memory package of claim 1, wherein the memory package communicates with the external device based on a double data rate (DDR) interface.

12. A memory module comprising:
a memory package comprising a volatile memory chip and a nonvolatile memory chip; and
a random access memory (RAM) control device configured to control the memory package under control of an external device, and to periodically transmit a refresh command to the memory package,
wherein the memory package performs a refresh operation on the volatile memory chip in response to the refresh command, and to migrate at least a portion of data stored in the nonvolatile memory chip to the volatile memory chip during the refresh operation,
wherein both the refresh operation and migration of at least a portion of data stored in the nonvolatile memory chip to the volatile memory chip occur in response to the refresh command.

13. The memory module of claim 12, wherein the memory package comprises a plurality of data signal lines, and
wherein the memory package exchanges data with the external device through a portion of the data signal lines, and migrates at least a portion of data stored in the nonvolatile memory chip to the volatile memory chip through remaining portion of the data signal lines.

14. The memory module of claim 12, wherein the memory package further comprises:
a logic chip configured to control the volatile memory chip and the nonvolatile memory chip under control of the RAM control device.

15. The memory module of claim 14, wherein the volatile memory chip and the nonvolatile memory chip are stacked in a direction perpendicular to the logic chip, and the nonvolatile memory chip, the volatile memory chip, and the logic chip are connected to each other through a through silicon via.

16. The memory module of claim 15, wherein the memory package migrates at least a portion of data stored in the nonvolatile memory chip to the volatile memory chip through the through silicon via.

17. An operation method of a memory package,
wherein the memory package comprises a volatile memory chip and a nonvolatile memory chip,
the operation method comprising:
receiving a refresh command from an external device; and
in response to the refresh command, migrating at least a portion of data stored in the nonvolatile memory chip to the volatile memory chip upon performing a refresh operation on the volatile memory chip,
wherein both the refresh operation and migrating at least a portion of data stored in the nonvolatile memory chip to the volatile memory chip occur in response to the refresh command.

* * * * *